_(12)_ United States Patent
Kwon et al.

(10) Patent No.: US 7,458,675 B2
(45) Date of Patent: Dec. 2, 2008

(54) INKJET PRINTING SYSTEM AND DRIVING METHOD THEREOF

(75) Inventors: Seong-Gyu Kwon, Suwon-si (KR);
Yoon-Ho Kang, Yongin-si (KR);
Jang-Sub Kim, Suwon-si (KR);
Byoung-Joo Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 258 days.

(21) Appl. No.: 11/373,759

(22) Filed: Mar. 10, 2006

(65) Prior Publication Data

US 2006/0252185 A1    Nov. 9, 2006

(30) Foreign Application Priority Data

May 3, 2005    (KR)    ............... 10-2005-0036989

(51) Int. Cl.
*B41J 2/01*    (2006.01)
(52) U.S. Cl. ..................................... 347/104
(58) Field of Classification Search .............. 347/104
See application file for complete search history.

(56) References Cited

U.S. PATENT DOCUMENTS 6,145,981 A * 11/2000 Akahira et al. ............. 347/107
7,006,201 B2 * 2/2006 Uemura ...................... 355/73
7,217,438 B2 * 5/2007 Newsome et al. ........... 427/8
2003/0108804 A1  6/2003 Cheng et al. ................ 430/7

FOREIGN PATENT DOCUMENTS

| JP | 8-86913 | 4/1996 |
|---|---|---|
| JP | 2000-233495 | 8/2000 |
| JP | 2001-205795 | 7/2001 |
| JP | 2003-29017 | 1/2003 |
| JP | 2004-101218 | 4/2004 |
| JP | 2004-337702 | 12/2004 |
| JP | 2004-337726 | 12/2004 |
| KR | 10-0382518 | 4/2003 |
| KR | 10-0437799 | 6/2004 |
| KR | 10-0438576 | 6/2004 |
| KR | 10-0453607 | 10/2004 |

* cited by examiner

*Primary Examiner*—Matthew Luu
*Assistant Examiner*—Brian J Goldberg
(74) *Attorney, Agent, or Firm*—Cantor Colburn LLP

(57) ABSTRACT

An inkjet printing system is provided, which includes a first stage mounted with a mother glass including a plurality of substrates and a plurality of alignment keys, a head unit having at least one inkjet head, an alignment key position sensor for sensing positions of the alignment keys to generate a plurality of sensing signals respectively corresponding to the alignment keys, and a transporting unit controller for aligning a position of the head unit based on a current position of the head unit and positions determined by the corresponding sensing signals with respect to the corresponding alignment keys.

9 Claims, 16 Drawing Sheets

INKJET PRINTING SYSTEM AND DRIVING METHOD THEREOF

This application claims priority to Korean Patent Application No. 10-2005-0036989, filed on May 03, 2005 and all the benefits accruing therefrom under 35 U.S.C. §119, and the contents of which in it entirety are herein incorporated by reference.

BACKGROUND OF THE INVENTION (a) Field of the Invention

The present invention relates to an inkjet printing system and a driving method of the inkjet printing system. More particularly, the present invention relates to an inkjet printing system for precisely forming color filters or light emitting members on a substrate and a driving method of the inkjet printing system.

(b) Description of the Related Art

Inkjet printing systems are used for forming organic light emitting members of organic light emitting displays ("OLED"s), color filters and alignment layers for liquid crystal displays ("LCD"s), and so on.

The inkjet printing systems for forming the color filters, alignment layers, or organic light emitting members include a head unit and an inkjet head attached to the head unit. The inkjet head has a plurality of nozzles. Thereby, the inkjet printing systems deposit ink or other material through the nozzles into desired areas on an insulating substrate to form the colors filters, alignment layers, or organic light emitting members.

At this time, for accurately depositing the inks or other material, alignment of the inkjet head is required.

As a size of a mother glass which is divided into a plurality of cells respectively used as substrates for panels of display devices becomes larger, the number of cells is increased and thereby the time for aligning the head unit and the inkjet head increases.

BRIEF SUMMARY OF THE INVENTION

The present invention solves the problems of conventional techniques by providing an inkjet printing system for precisely forming color filters or light emitting members on a substrate and a driving method of the inkjet printing system.

In exemplary embodiments of the present invention, an inkjet printing system is provided, which includes a first stage mounted with a mother glass including a plurality of substrates and a plurality of alignment keys, a head unit having at least one inkjet head, an alignment key position sensing unit for sensing positions of the alignment keys to generate a plurality of sensing signals respectively corresponding to the alignment keys, a memory for storing the sensing signals, and a transporting unit controller for aligning a position of the head unit based on a current position of the head unit and positions determined by the corresponding sensing signals with respect to the corresponding alignment keys of the stored sensing signals.

The plurality of alignment keys may include a first alignment key group formed near to a first side of each respective substrate and a second alignment key group formed opposite to the first alignment key group near a second side of each respective substrate, the second side facing the first side.

The corresponding alignment keys may be included in the first and second alignment key groups, respectively.

The alignment key position sensing unit may include at least one alignment key position sensor, and the alignment key position sensor may be a charged coupled device ("CCD") camera.

The alignment key position sensing unit may be attached to a second stage.

The second stage may be substantially similar in size and shape to the mother glass.

The second stage may be positioned above the head unit or between the head unit and the mother glass.

The alignment key position sensing unit may include a sensor movable with respect to the second stage, and the second stage may be fixed relative to the mother glass.

Alternatively, the alignment key position sensing unit and the second stage may move together relative to the mother glass, and the second stage may be smaller than the mother glass.

Each substrate may include a light blocking member having a plurality of openings, and the inkjet head deposits ink into the openings.

Alternatively, each substrate includes portions of an organic light emitting display having a plurality of openings, and the at least one inkjet head deposits light emitting material into the openings.

In other exemplary embodiments of the present invention, a driving method of an inkjet printing system for aligning a position of a head unit above a substrate formed on a mother glass using a plurality of alignment keys and depositing material on the substrate is provided, which includes sensing positions of the alignment keys using an alignment key position sensing unit to generate a plurality of sensing signals respectively corresponding to the alignment keys, storing the sensing signals into a memory, aligning a position of the head unit based on a current position of the head unit and positions determined by the sensing signals of corresponding alignment keys with respect to an area of the substrate, and depositing the material on the area.

The plurality of alignment keys may include a first alignment key group formed near a first side of the respect substrate, and a second alignment key group formed opposite to the first alignment key group near a second side of the substrate, the second side facing the first side.

The corresponding alignment keys may be included in the first and second alignment key groups, respectively.

Depositing the material may include depositing ink to form color filters. Alternatively, depositing the material forms light emitting members.

The alignment key position sensing unit may include at least one alignment key position sensor, and the alignment key position sensor is a CCD camera.

In other exemplary embodiments of the present invention, an inkjet printing system includes a stage mounted with a mother glass, the mother glass including at least one substrate and a plurality of alignment keys, a head unit having at least one inkjet head, an alignment key position sensor sensing positions of the alignment keys to generate sensing signals respectively corresponding to the alignment keys, and a transporting unit controller aligning a position of the head unit based on a current position of the head unit and the sensing signals from the alignment key position sensor.

The alignment key position sensor may be positioned on the inkjet head.

The alignment key position sensor may generate first sensing signals corresponding to a pair of alignment keys disposed on opposite sides of one of the at least one substrate, and outputs the first sensing signals to the transporting unit controller.

An aligned head unit performs a scan to deposit material on the substrate, and the sensing signals may be sent to the transporting unit controller after each scan of the head unit.

The alignment key position sensor may be a charged coupled device camera.

The system may further include a transporting unit moving the head unit relative to the mother glass, the transporting unit receiving control signals from the transporting unit controller.

A number of alignment keys on the mother glass may depend on a screen resolution of a display device that includes one of the at least one substrate, a number of nozzles on each of the at least one inkjet head, and a number of substrates on the mother glass.

The alignment key position sensor may be movable independent of the head unit.

In other exemplary embodiments of the present invention, a driving method of an inkjet printing system, for aligning a position of a head unit above a substrate formed on a mother glass using a plurality of alignment keys and depositing material on the substrate, includes sensing positions of a subset of the alignment keys using an alignment key position sensor to generate sensing signals respectively corresponding to the subset of the alignment keys, aligning a position of the head unit based on a current position of the head unit and positions determined by the sensing signals with respect to an area of the substrate, and depositing the material on the area.

The alignment key position sensor may move with the head unit and the method may be repeated for each area of the substrate.

The subset of alignment keys may include a first alignment key on a first side of the substrate and a second alignment key on a second side of the substrate, the second side opposite the first side.

BRIEF DESCRIPTION OF THE DRAWINGS

The present invention will become more apparent by describing preferred embodiments thereof in detail with reference to the accompanying drawings, in which.

DETAILED DESCRIPTION OF THE INVENTION

Figure 1:
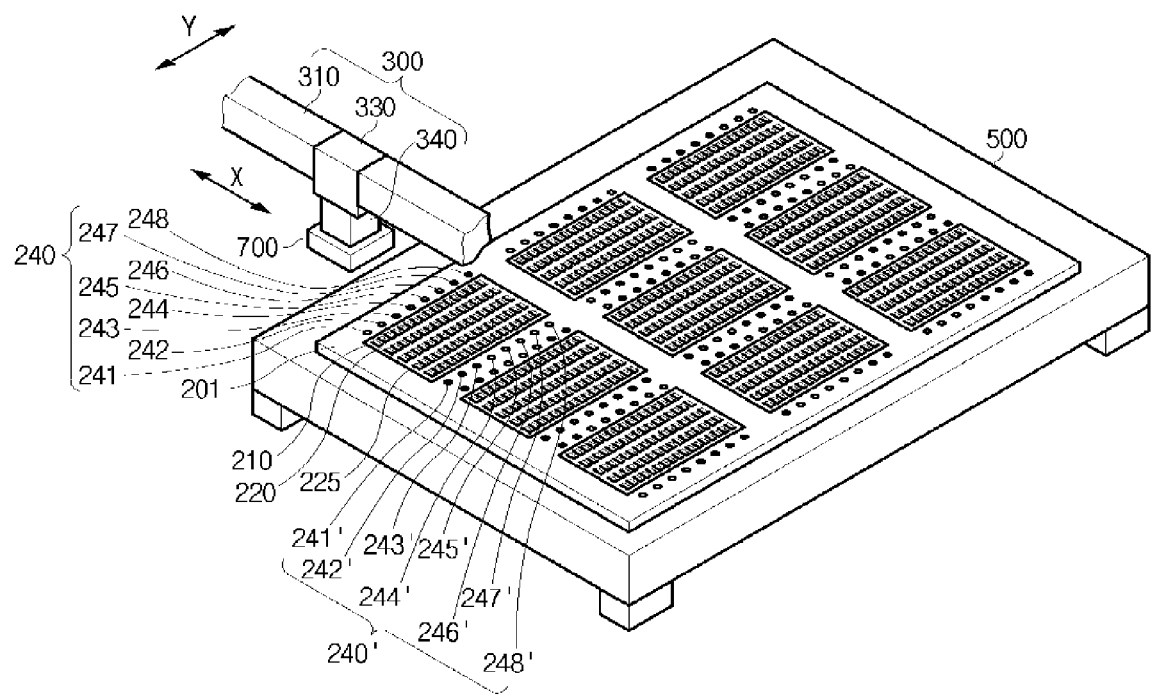
FIG. 1 is a perspective view of an exemplary embodiment of an inkjet printing system according to the present invention.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the drawings, the thickness of layers and regions are exaggerated for clarity.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

The present invention will be described more fully hereinafter with reference to the accompanying drawings, in which preferred embodiments of the invention are shown. Exemplary embodiments of inkjet printing systems and driving methods of the inkjet printing systems according to the present invention will now be described with reference to FIGS. 1 to 4.

Figure 2:
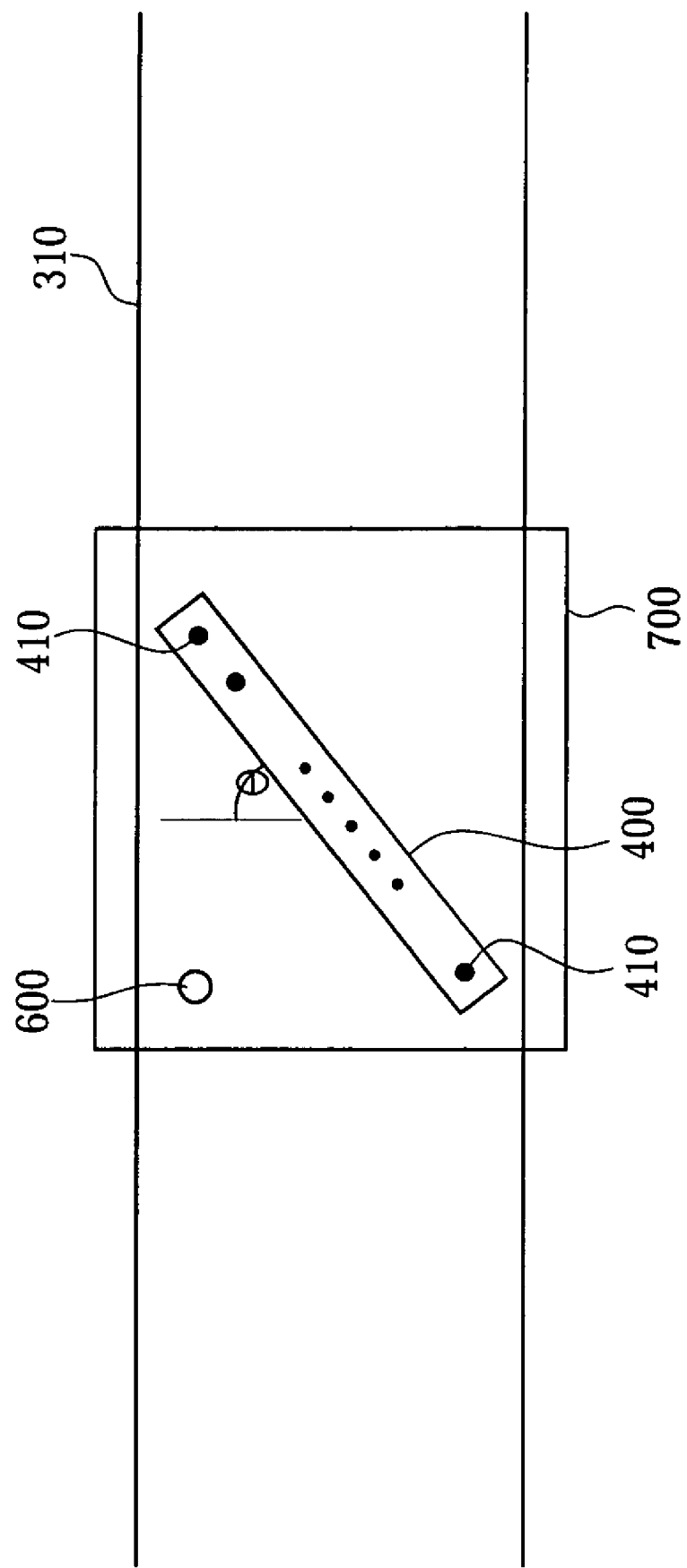
FIG. 2 is a bottom view of an exemplary head unit of an exemplary embodiment of an inkjet printing system according to the present invention.
Figure 3:
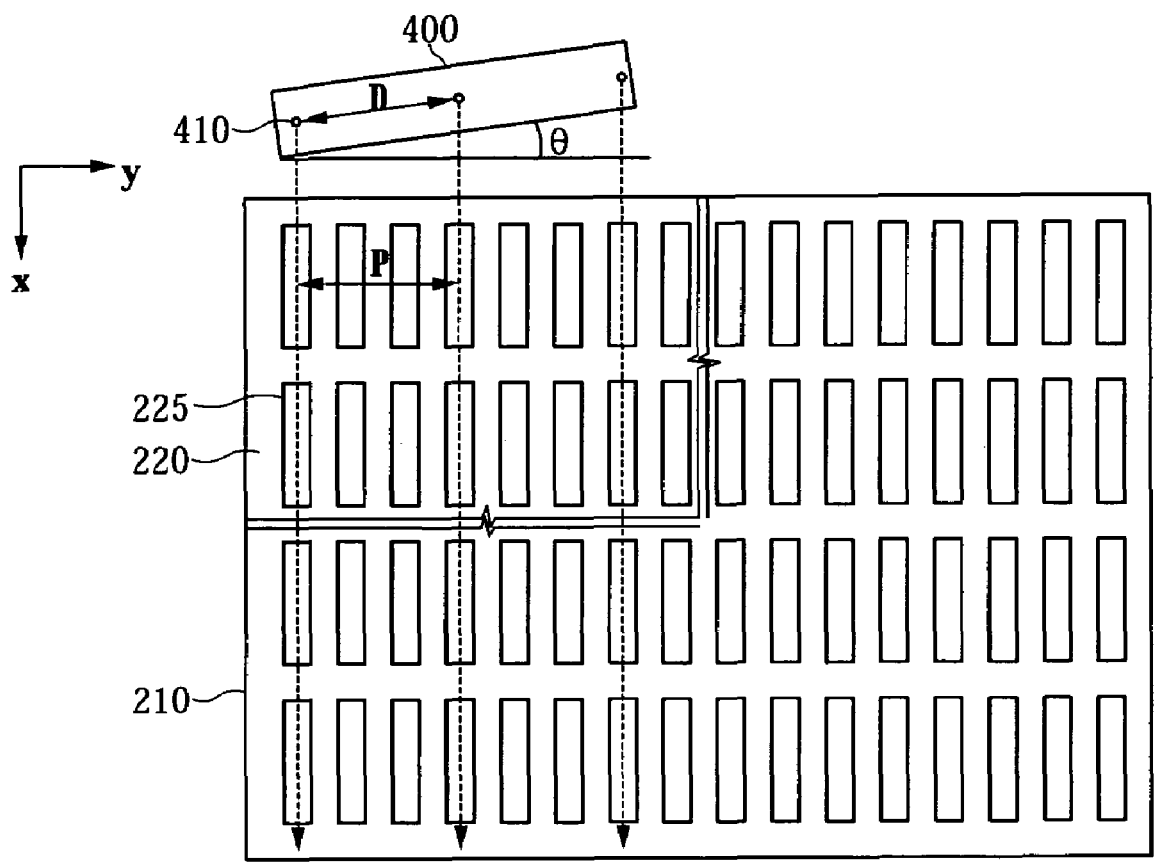
FIG. 3 is a schematic view for demonstrating formation of color filters using an exemplary inkjet head of an exemplary embodiment of an inkjet printing system according to the present invention.
Figure 4:
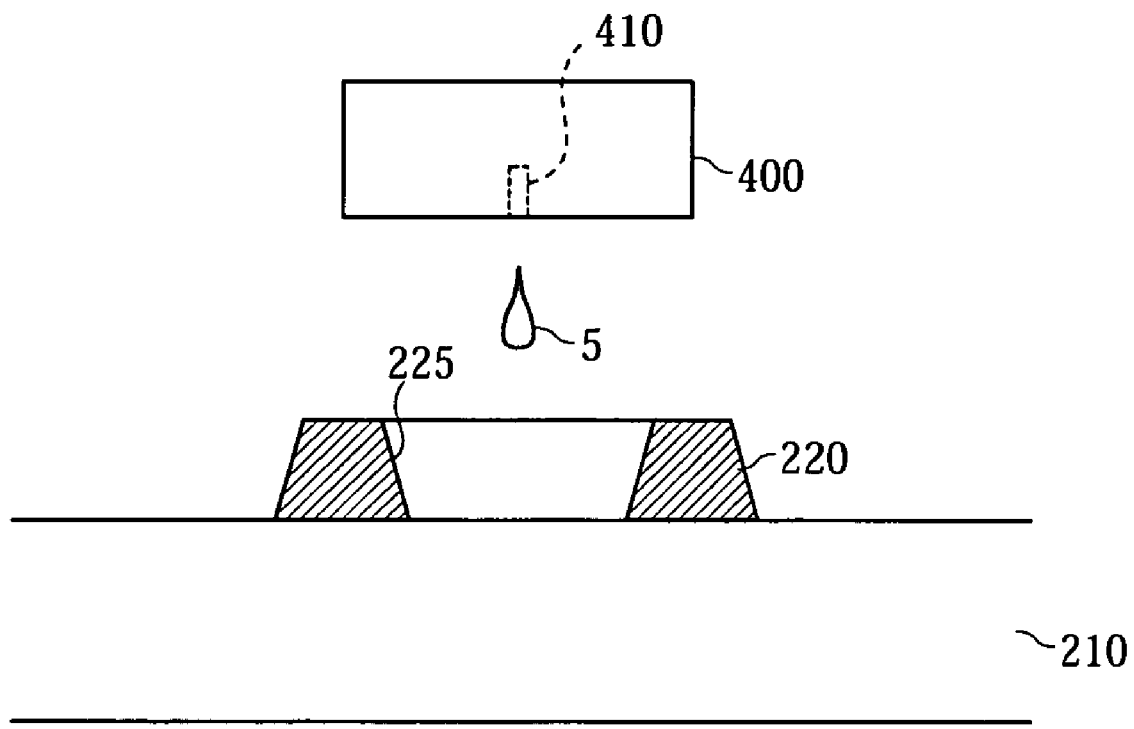
FIG. 4 illustrates a state of depositing ink for forming color filters using an exemplary inkjet head of an exemplary embodiment of an inkjet printing system according to the present invention.

FIG. 1 is a perspective view of an exemplary embodiment of an inkjet printing system according to the present invention, FIG. 2 is a bottom view of an exemplary head unit of an exemplary embodiment of an inkjet printing system according to the present invention, FIG. 3 is a view demonstrating formation of color filters using an exemplary inkjet head of an exemplary embodiment of an inkjet printing system according to the present invention, and FIG. 4 illustrates a state of depositing ink for forming color filters using an exemplary inkjet head of an exemplary embodiment of an inkjet printing system according to the present invention.

Referring to FIGS. 1 to 4, an inkjet printing system includes a stage 500 on which a mother glass 201 is disposed, a head unit 700 spaced a predetermined distance from the stage 500 in a vertical direction, and a transporting unit 300 for transporting the head unit 700 to a predetermined position.

The mother glass 201 may be substantially planar to be supported by a substantially planar stage 500, and is divided to produce insulating substrates 210 used for panels of display devices, such as color filter panels of liquid crystal display ("LCD") devices, as will be further described below. Alternatively, the stage 500 may be provided with a panel for forming display panels of organic light emitting displays ("OLED"s), as will also be further described below.

A light blocking member 220, having a plurality of openings 225, is formed on each of the insulating substrates 210.

A plurality of alignment keys 240 and 240', respectively comprising alignment keys 241 to 248 and 241' to 248', are formed on opposite sides of each of the respective insulating substrates 210, that is, at areas outside of the light blocking member 220.

By example only, the insulating substrates 210 and corresponding light blocking members 220 may each have a substantially rectangular shape with first and second parallel opposite sides. The alignment keys 240 are formed on the first side of each substrate 210 in a line at a predetermined interval, and the alignment keys 240' are formed on the second side opposite to the first side of each substrate 210, and the alignment keys 240' face the corresponding alignment keys 240. The line of alignment keys 240 and the line of alignment keys 240' may extend substantially parallel to the first and second sides of each insulating substrate 210. Alternatively, the lines of alignment keys 240 and 240' may extend adjacent third and fourth sides of each insulating substrate 210 and each light blocking member 220.

When the light blocking member 220 is made of an organic high molecular compound, the alignment keys 240 and 240' are formed by exposing and developing the organic material as a positive or negative type. However, if the light blocking member 220 is made of inorganic materials, and after depositing a separate photoresist film, then the alignment keys 240 and 240' are formed on the material of the light blocking member 220 by exposing, developing, and etching the inorganic material. The alignment keys 240 and 240' may be of a circular shape, a cross shape, or other various shapes.

The head unit 700 includes an inkjet head 400 and an alignment key position sensor 600.

The inkjet head 400 has a long bar-like shape, however it is not limited to such shape. The inkjet head 400 includes a plurality of nozzles 410 provided on substantially an entire lower surface thereof. Ink 5 for forming color filters for a color filter panel is deposited through the nozzles 410 on the substrate 210. In the event the inkjet printing system is used for providing an alignment layer or organic light emitting members to a substrate, the nozzles 410 may provide materials, other than ink 5, to the substrate on the stage 500.

The inkjet head 400 is inclined to a predetermined angle θ with respect to the Y direction. For example, since a nozzle pitch D (a distance between adjacent nozzles 410) is different from a pixel pitch P (a distance between adjacent pixels to be printed), by rotating the inkjet head 400 to the predetermined angle θ, an interval between adjacent ink deposits through the nozzles 410 and the pixel pitch P may coincide. Thus, substrates used for a display having a particular pixel pitch P may be accommodated by rotating the inkjet head 400 to the appropriate angle θ for proper ink deposition regardless of the difference between the nozzle pitch D and the pixel pitch P.

In FIG. 2, one head unit 700 is shown, however there may be a plurality of head units 700. Also, while the illustrated head unit 700 includes only one inkjet head 400, a plurality of inkjet heads 400 for forming color filters for colors such as, but not limited to, red, green, and blue colors may be provided.

The alignment key position sensor 600 senses positions of the alignment keys 240 and 240' and outputs sensing signals corresponding to the sensed positions to a transporting unit controller (not shown). The alignment key position sensor 600 may be, for example, a charged coupled device ("CCD") camera.

The transporting unit 300 includes a supporting unit 310 to space the head unit 700 from the substrates 210 by a predetermined distance, a transporting portion 330 for transporting the head unit 700 in X and Y directions, and an elevating unit 340 for elevating the head unit 700.

The number of alignment keys 240 and 240' may be defined based on screen resolutions of the display devices manufactured or the number of nozzles 410.

For example, when an LCD having a screen resolution of 1024×768 is manufactured on the substrate 210 and the number of nozzles 410 of the inkjet head 400 is 128, then a color filter group having 128×768 color filters is formed through the nozzles 410 of the inkjet head 400 by one scan of the head unit 700 in the X direction by the transporting portion 330 of the transporting unit 300. That is, the color filters of 128×768 are formed into openings 225 of the light blocking member 220 formed in a pixel block of 128×768 pixels, respectively. As a result, since one scan of the head unit 700 does not form all color filters on all pixels of the LCD, a plurality of scans of the head unit 700 are required. In the LCD, the total scanning number is eight (128×8=1024).

Before every scanning procedure of the head unit 700 in the X direction for forming the color filters, an alignment procedure of the head unit 700 is performed using the alignment keys 240 and 240'. Therefore, for example, when the LCD having a screen resolution of 1024×768 is manufactured, the alignment procedure is repeated eight times, and thus the number of alignment keys 240 and 240' for each respective insulating substrate 210 is required to be eight. In other words, the total number of alignment keys 240 and 240' formed on opposite sides of each respective substrate 210 is sixteen. Referring to FIG. 1, since the total number of substrates 210 formed on the mother glass 201 is nine, the total number of the alignment keys 240 and 240' formed on the mother glass 201 is 144 (16×9=144). The total number of alignment keys 240 and 240' formed on the mother glass 201 would thus depend on the total number of substrates 210 formed on the mother glass 201, as well as on the screen resolution of the LCD and the number of nozzles 410.

Next, an exemplary method for forming the color filters on the substrate 210 using an exemplary embodiment of an inkjet printing system according to the present invention will be further described.

The head unit 700 is arranged over the corresponding substrate 210 by the transporting portion 330 and elevating portion 340 of the transporting unit 300.

The head unit 700 is transported in the X direction by the transporting portion 330 of the transporting unit 300, and the alignment key position sensor 600 is operated. The sensor 600 generates alignment key position sensing signals corresponding to the alignment keys 241 and 241', respectively, and outputs the alignment key position sensing signals to the transporting unit controller (not shown).

The transporting unit controller compares the sensing signals from the alignment key position sensor 600 with the current position of the head unit 700, generates control signals for transporting the head unit 700 to the scanning start position, and outputs the control signals to the transporting unit 300.

Thereby, the transporting portion 330 of the transporting unit 300 arranges the head unit 700 to the scanning start position based on the control signals from the transporting unit controller. Next, by operating the transporting portion 330 of the transporting unit 300 and the nozzles 410 of the inkjet head 400, the inkjet printing system transfers the head unit 700 in the X direction, and thereby, as shown in FIG. 4, the color filters are formed on pixels of one pixel block by ink 5 deposited into the openings 225 of the light blocking member 220 within the one pixel block, where a pixel block includes a matrix of pixels, such as a subset of the total number of pixels for the display.

When the scanning of the head unit 700 for forming the color filters is finished, the transporting portion 330 of the transporting unit 300 repeats the aligning procedure of the head unit 700 for the next scan, to form color filters on the next pixel block.

In the same way as described above, the sensor 600 senses positions of the alignment keys 242 and 242' adjacent to the alignment keys 241 and 241', respectively, and generates alignment key position sensing signals to output to the transporting unit controller. The transporting unit controller compares positions of the alignment keys 242 and 242', determined by the sensing signals from the sensor 600, with the current position of the head unit 700, and generates control signals for transporting the head unit 700 to the scanning start position and outputs the control signals to the transporting unit 300. Thereby, the head unit 700 at the transporting unit 300 is moved in the X or Y direction to be positioned at the next scanning start position.

Then, another scan of the head unit 700 is performed to form color filters in pixels of the next pixel block.

Whenever forming the color filters in a corresponding pixel block, the position sensing operation of the alignment key position sensor 600 and the position alignment and ink deposition operations of the head unit 700 are repeated, to form all the color filters.

When all the color filters are formed on the corresponding substrate 210, the head unit 700 is arranged over the next substrate 210 by the transporting unit 300 and the color filter forming operation is repeated on the next substrate 210. As a result, the color filters are formed on all the substrates 210 of the mother glass 201.

By the aligning operation of the head unit 700 using the alignment keys 240 and 240' and the sensor 600, the color filters are formed on the desired positions of the substrates 210. Accordingly, the reliability of forming the color filters at appropriate locations on the substrates 210 is increased and the manufacturing cost is decreased.

Next, referring to FIGS. 5 to 7, another exemplary embodiment of an inkjet printing system according to the present invention will be described.

The structures and operations of the inkjet printing system are substantially the same as those of the inkjet printing system shown in FIGS. 1 to 4.

As compared with FIGS. 1 to 4, the elements performing the same operations are indicated by the same reference numerals, and detailed descriptions thereof are omitted.

Figure 5:
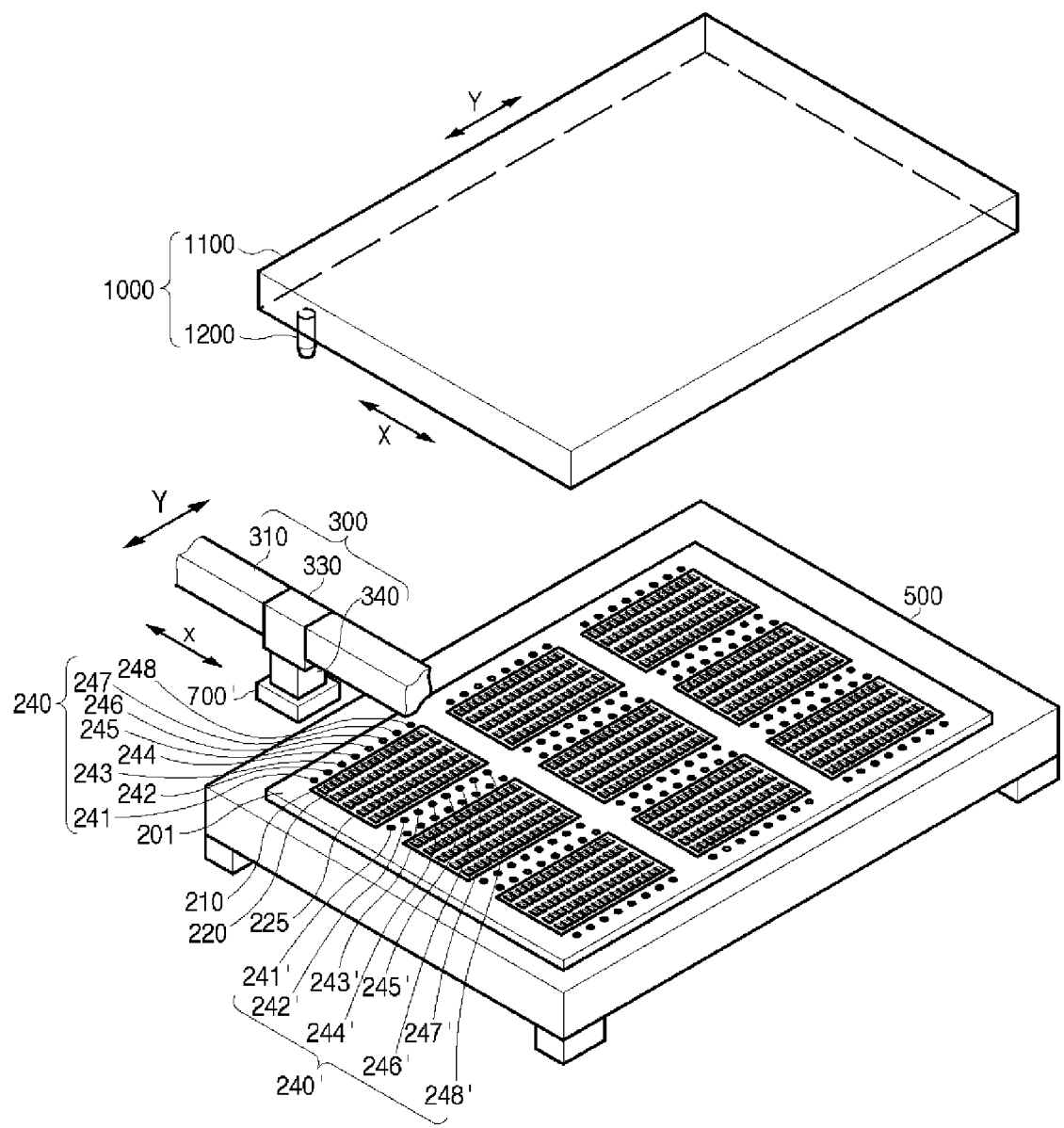
FIG. 5 is a perspective view of another exemplary embodiment of an inkjet printing system according to the present invention.
Figure 6:
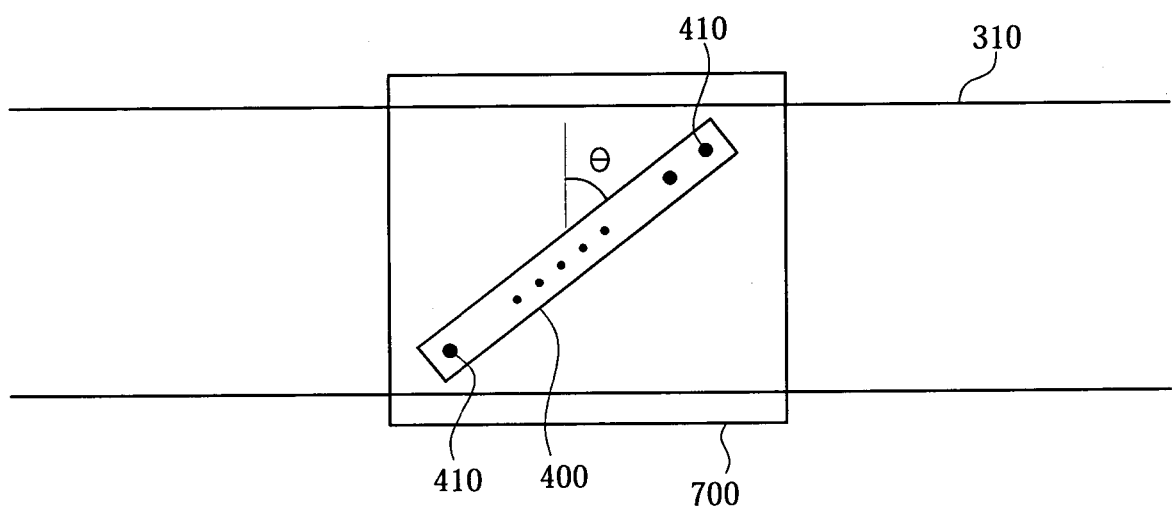
FIG. 6 is a bottom view of an exemplary head unit of another exemplary embodiment of an inkjet printing system according to the present invention.
Figure 7:
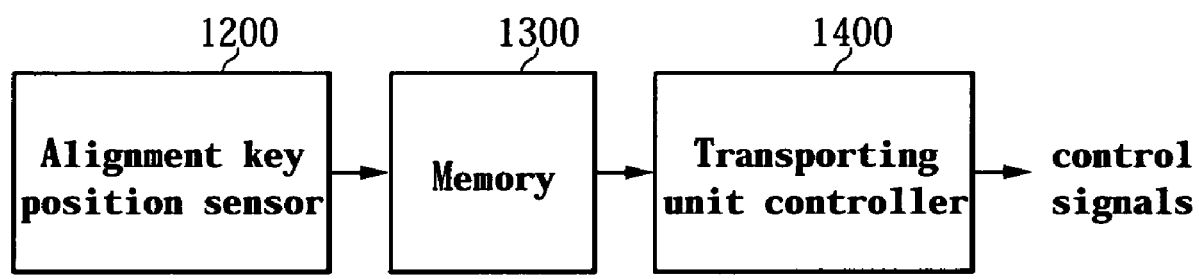
FIG. 7 is a block diagram of an exemplary alignment key sensing unit of another exemplary embodiment of an inkjet printing system according to the present invention.

FIG. 5 is a perspective view of another exemplary embodiment of an inkjet printing system according to the present invention, FIG. 6 is a bottom view of an exemplary head unit of another exemplary embodiment of an inkjet printing system according to the present invention, and FIG. 7 is a block diagram of an exemplary alignment key sensing unit of another exemplary embodiment of an inkjet printing system according to the present invention.

As compared with FIG. 1, an inkjet printing system shown in FIG. 5 further includes an alignment key sensing unit 1000. In addition, as shown in FIG. 5, a head unit 700' does not include the alignment key position sensor 600 as compared to FIG. 1.

As shown in FIGS. 5 to 7, the alignment key sensing unit 1000 includes a stage 1100, an alignment key position sensor 1200 attached to the stage 1100, a memory 1300 connected to the alignment key position sensor 1200, and a transporting unit controller 1400 connected to the memory 1300.

As illustrated, the stage 1100 may have a similar size and shape to those of the mother glass 201, but the size and shape are not limited thereto.

The alignment position sensor 1200 is a CCD camera movable in X and Y directions of the stage 1100 by a separate controller (not shown). For movement of the alignment position sensor 1200, moving members (not shown) may be provided on the stage 1100.

Alternatively, the alignment key position sensor 1200 may be fixed on the stage 1100 and the position of the sensor 1200 may be varied by movement of the stage 1100. In this case, the size and shape of the stage 1100 may be dissimilar to those of the mother glass 201, and, for example, the size of the stage 1100 may be smaller than that of the mother glass 201.

The alignment key position sensor 1200 transfers in the X or Y direction and, at the same time, senses positions of all alignment keys 240 and 240' formed on the mother glass 201 to generate a plurality of alignment key position sensing signals corresponding to the position of the respective alignment keys 240 and 240'. For example, each sensing signal may have X and Y coordinate values. In FIG. 5, one alignment key position sensor 1200 is shown, but more than one alignment key position sensors 1200 may be provided in alternative embodiments.

As illustrated, the alignment key sensing unit 1000 is positioned over the head unit 700', however, it may be positioned between the head unit 700' and the mother glass 201 for sensing purposes, and movable there between so as not to interfere with the printing process.

The memory 1300 stores the respective alignment key position sensing signals from the sensor 1200. The memory 1300 may be a random access memory ("RAM").

By using current position signals of the head unit 700' and the sensed position sensing signals of the corresponding alignment keys 240 and 240' from the memory 1300, the transporting unit controller 1400 generates control signals for controlling the position of the head unit 700', and outputs the control signals to the transporting unit 300.

An exemplary forming method of the color filters using another exemplary embodiment of the inkjet printing system according to the present invention will now be described.

The inkjet printing system transfers the alignment key position sensor 1200 of the alignment key sensing unit 1000 in the X or Y direction, to sense positions of all the alignment keys 240 and 240' formed on the mother glass 201 for generating the alignment key position sensing signals corresponding to the alignment keys 240 and 240'. The alignment key position sensing signals are stored into the memory 1300.

For a first scan of the head unit 700' for forming the color filters on a corresponding substrate 210, the transporting unit controller 1400 reads the current position signals of the head unit 700' and the stored alignment key position sensing signals of corresponding alignment keys 241 and 241', and compares the current position of the head unit 700' with the positions of the alignment keys 241 and 241'. The transporting unit controller 1400 generates a control signal for transferring the head unit 700' to a scanning start position based on a comparison result between the current position of the head unit 700' and the positions of the alignment keys 241 and 241' and outputs the control signal to the transporting unit 300.

The transporting portion 330 of the transporting unit 300 transfers the head unit 700' to the scanning start position in accordance with the control signal from the controller 1400, and moves the head unit 700' in the X direction to form the color filters in pixels of a first pixel block by depositing ink 5 into openings 225 of a light blocking member 220.

By repeating the above-described operations, the color filters are formed in a second pixel block adjacent to the first pixel block.

That is, the transporting unit controller 1400 reads the current position signals of the head unit 700' and the stored alignment key position sensing signals of corresponding alignment keys 242 and 242' adjacent to the alignment keys 241 and 241', respectively, and compares the current position of the head unit 700' with the positions of the alignment keys 242 and 242'. The transporting unit controller 1400 generates a control signal to move the head unit 700' to a scanning start position based on a comparison result and outputs the control signal to the transporting unit 300.

The transporting portion 330 of the transporting unit 300 transfers the head unit 700' to the scanning start position in accordance with the control signal from the controller 1400, and moves the head unit 700' in the X or Y direction to form the color filters in pixels of the second pixel block by depositing ink 5 into openings 225 of a light blocking member 220.

The forming operations of the color filters are repeated several times, and thereby the color filters are formed in all the pixels on the corresponding substrate 210. For example, when manufacturing the LCD having a screen resolution of 1024× 768, the forming operation of the color filters as described above is repeated eight times. When the formation of color filters is finished with respect to one substrate 210, the inkjet printing system transfers the head unit 700 to another substrate adjacent to the substrate 210 using the transporting unit 300, and repeats the forming operations of the color filters. Thereby, the color filters are successively formed on all the substrates 210 formed on the mother glass 201.

Since the inkjet printing system of FIGS. 5 to 7 aligns the position of the head unit 700 using the alignment key sensing unit 1000 and the alignment keys 240 and 240', the color filters are precisely formed on the desired positions of the substrates 210. Accordingly, reliability is increased and the manufacturing cost is decreased.

In addition, in the above embodiment of the inkjet printing system of FIGS. 5 to 7, since the alignment key position sensor 1200 attached to the alignment key sensing unit 1000 separately from the head unit 700 senses the positions of all the alignment keys 240 and 240' to generate the sensing signals and stores the sensing signals into the memory 1300, and the inkjet printing system uses the stored sensing signals for aligning the position of the head unit 700, the position sensing operation of the alignment keys 240 and 240' is not necessary whenever the position of the head unit 700 is aligned. Therefore, the time for forming the color filters is reduced.

In the exemplary embodiments described above, the head unit 700 or 700' moves as a result of the sensing operation of the alignment key position sensor 600 or 1200 to align the inkjet head 400, however, the inkjet head 400 along with the head unit 700 or 700' or the inkjet head 400 may move in response to a separate controller.

In addition, in the exemplary embodiments described herein, the head unit 700 or 700' moves as a result of the sensing operation of the alignment key position sensor 600 or 1200 to align the head unit 700 or 700,' however, in alternative embodiments, the stage 500 may move in response to a separate transporting unit.

While the exemplary embodiments have described the formation of color filters for a color filter panel of an LCD, alternatively a panel to be manufactured by the exemplary embodiments of the inkjet printing system according to the present invention may be a panel for an OLED. When a display panel for an OLED is produced, the inkjet printing system forms organic light emitting members of the OLED.

In the exemplary embodiments of the inkjet printing system, the head units 700 and 700' may be further aligned concerning position information of the mother glass 201 with respect to the stage 500 using separate alignment keys.

Next, an LCD using an exemplary panel manufactured by the exemplary embodiments of the inkjet printing system according to the present invention will be described with reference to FIGS. 8 to 13. The exemplary panel may be manufactured by either of the inkjet printing systems described with respect to FIGS. 1 to 4 and FIGS. 5 to 7.

Figure 8:
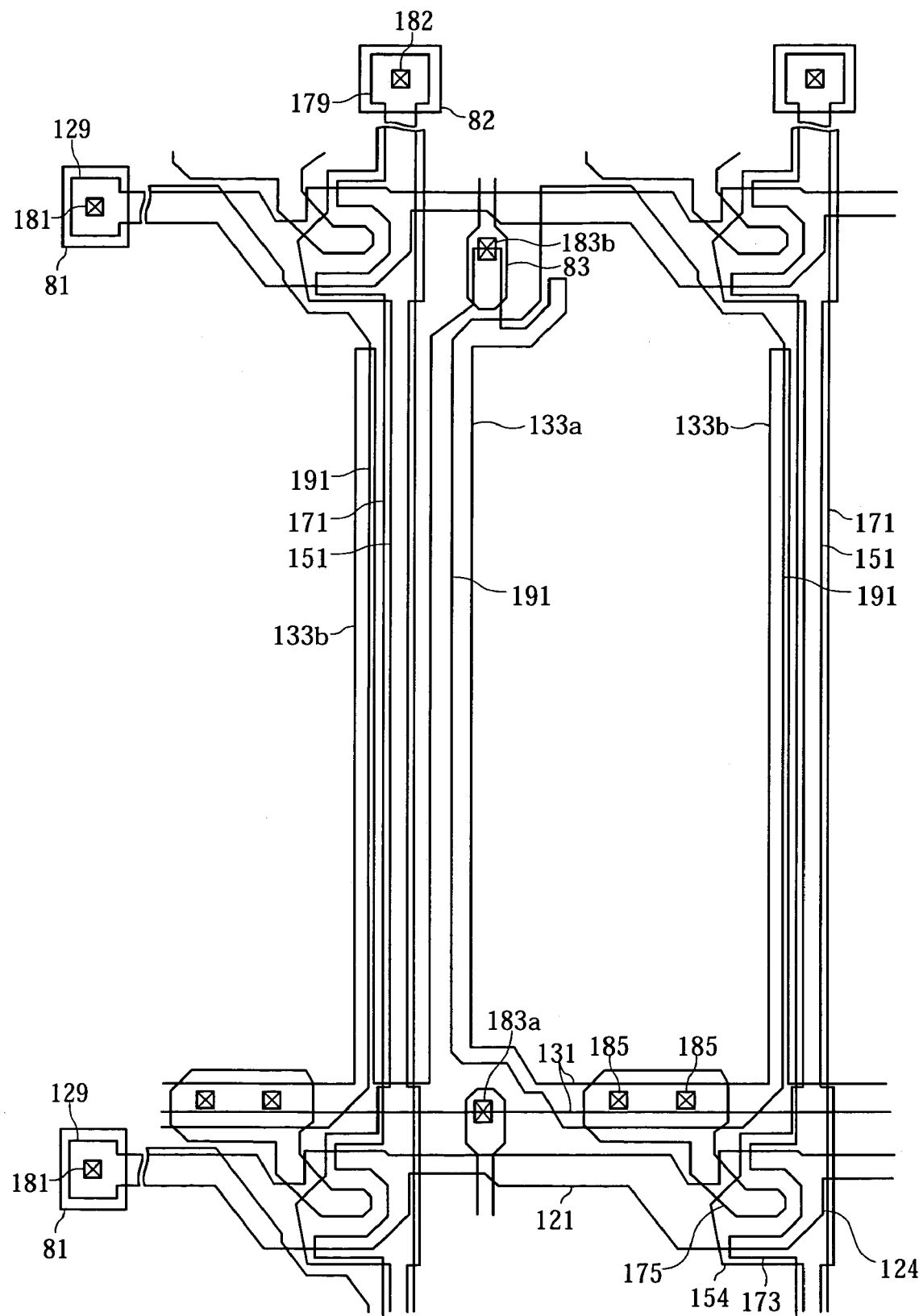
FIG. 8 is a layout view of an exemplary TFT array panel of the exemplary embodiments of an LCD according to the present invention.
Figure 9:
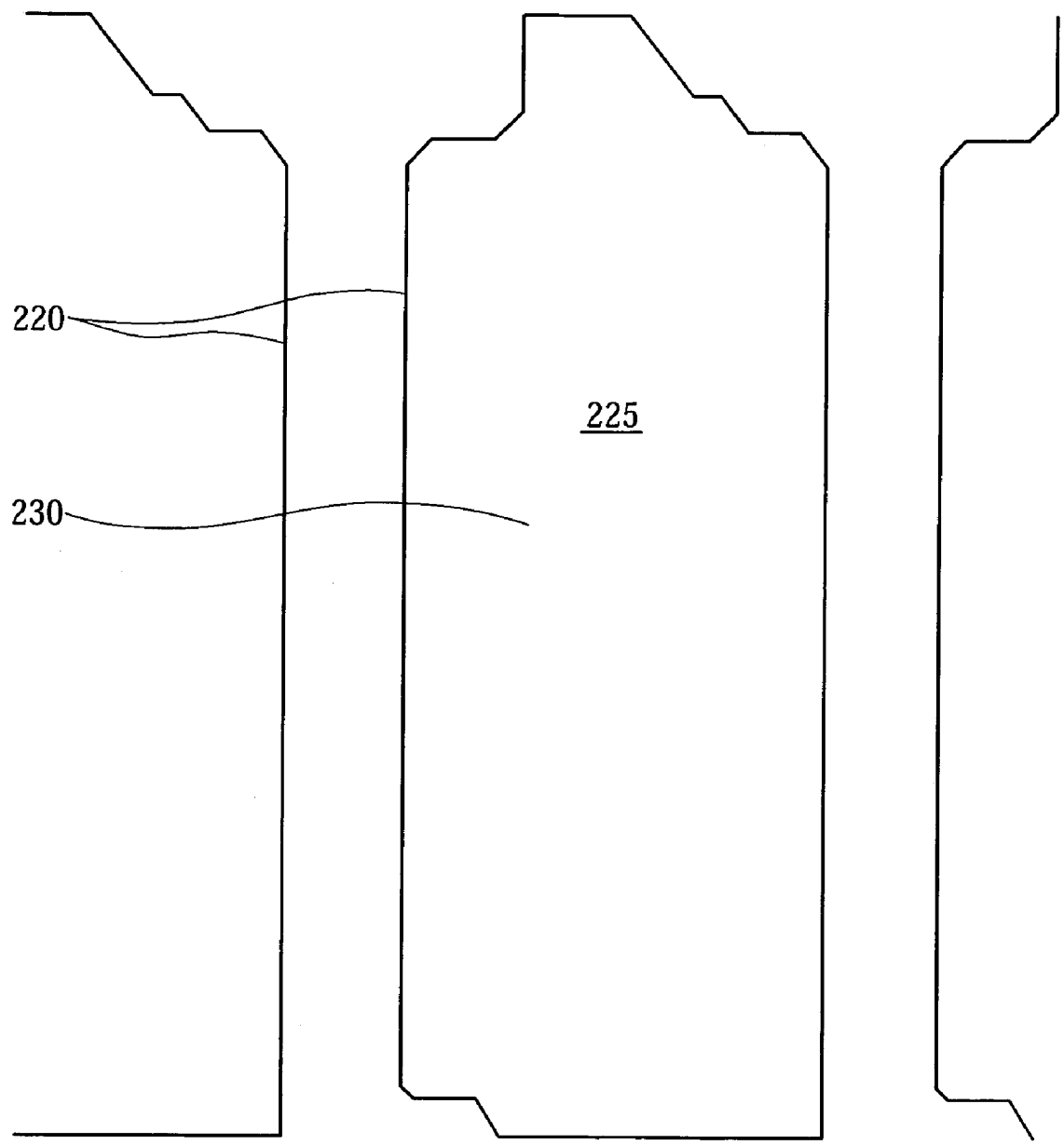
FIG. 9 is a layout view of an exemplary color filter panel of exemplary embodiments of an LCD according to the present invention.
Figure 10:
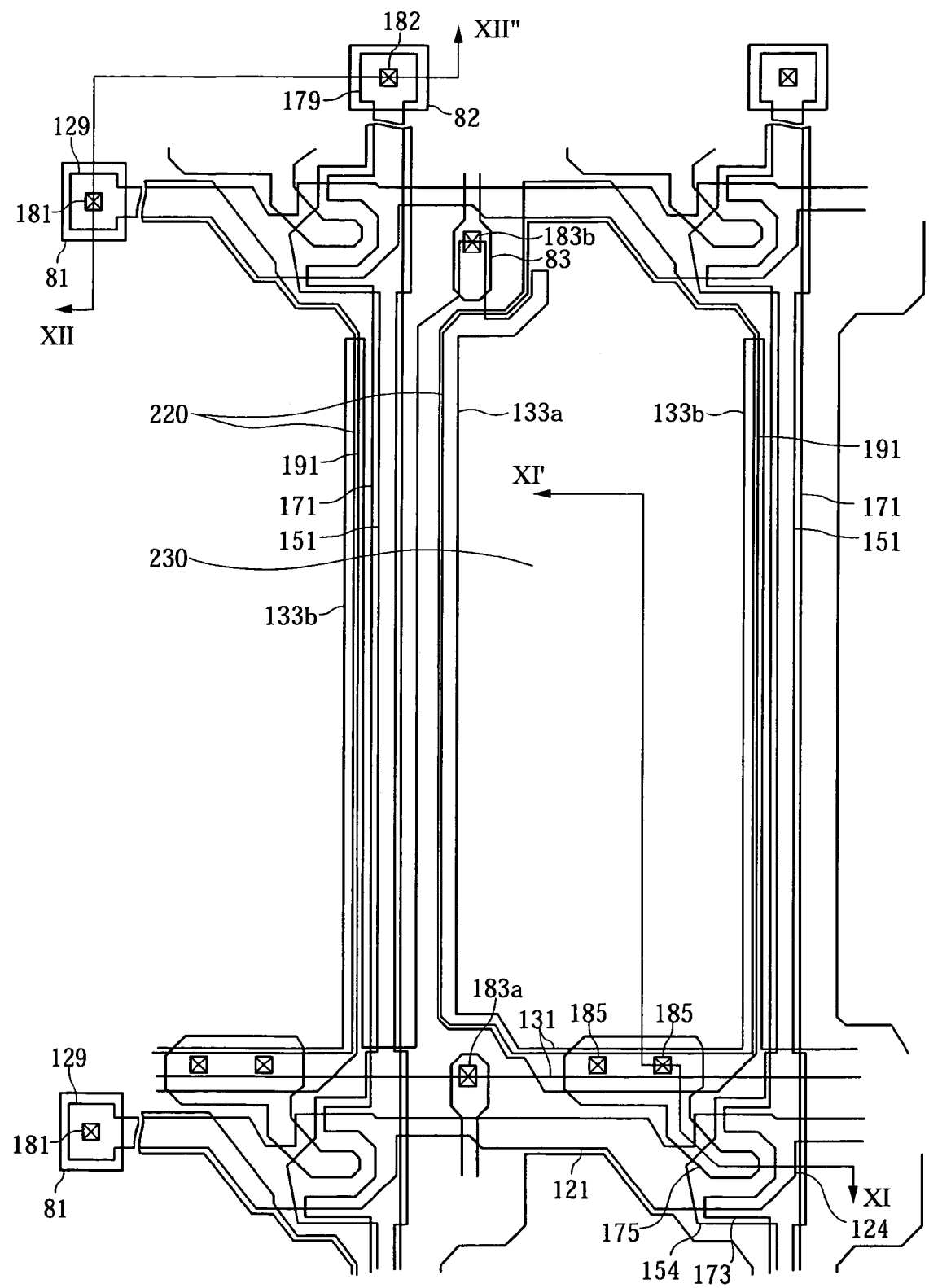
FIG. 10 is a layout view of the exemplary embodiments of the LCD having the exemplary TFT array panel and the exemplary color filter panel shown in FIGS. 8 and 9 according to the present invention.
Figure 11:
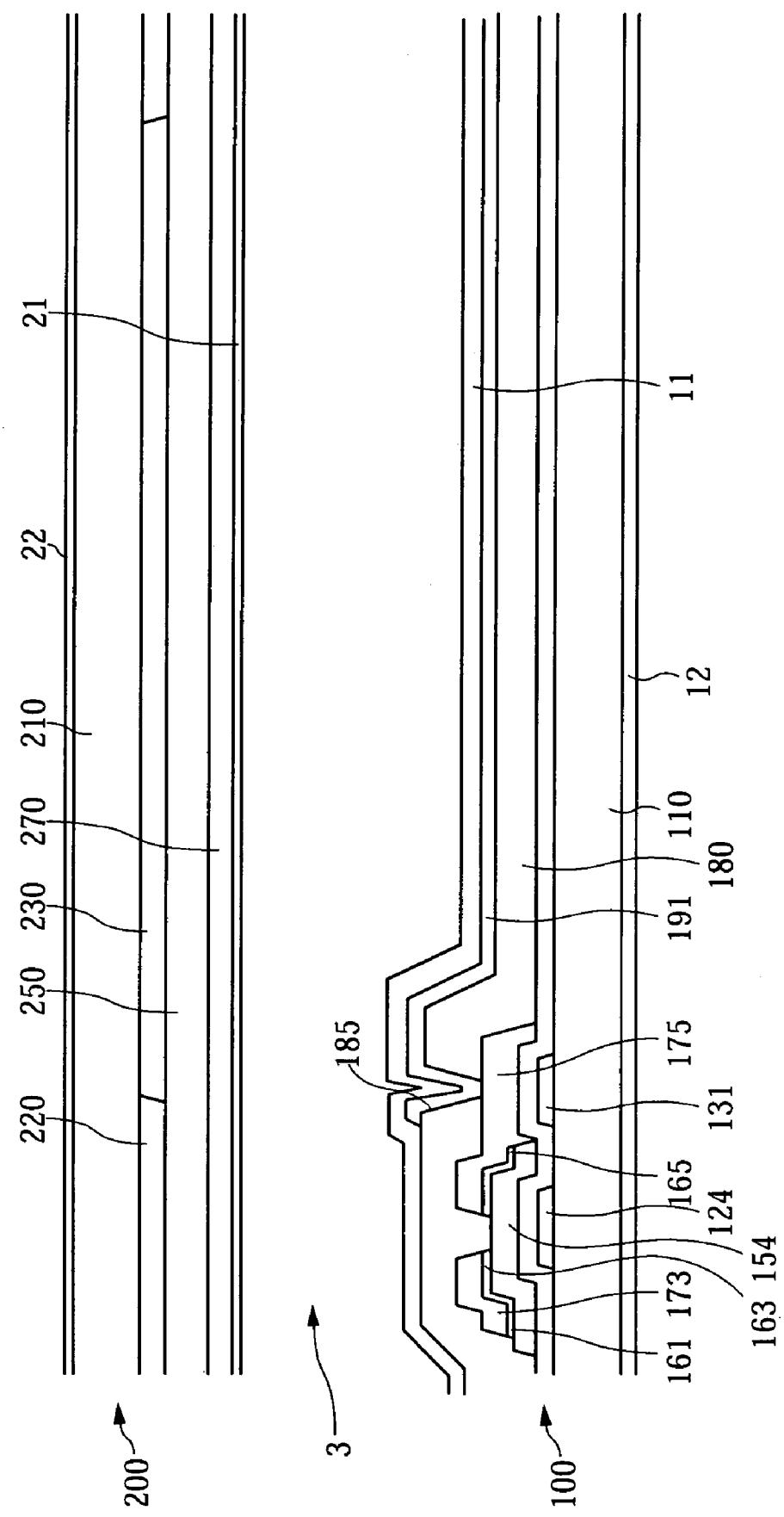
FIG. 11 is a sectional view of the exemplary LCD shown in FIG. 10 taken along line XI-XI'.
Figure 12:
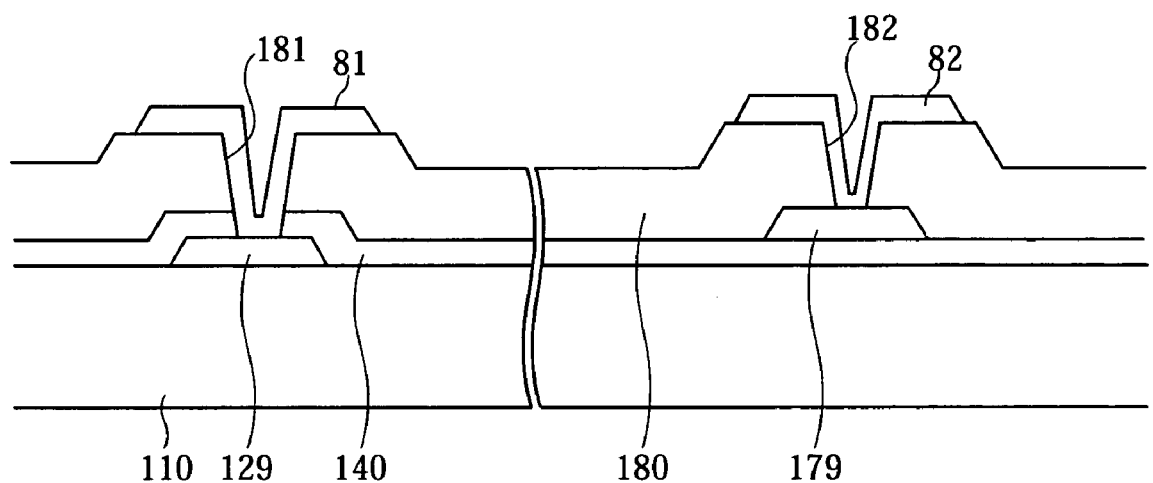
FIG. 12 shows sectional views of the exemplary LCD shown in FIG. 10 taken along line XII-XII'.

FIG. 8 is a layout view of an exemplary TFT array panel of exemplary embodiments of an LCD according to the present invention, and FIG. 9 is a layout view of an exemplary color filter panel of exemplary embodiments of an LCD according to the present invention. FIG. 10 is a layout view of exemplary embodiments of the LCD having the exemplary TFT array panel and the exemplary color filter panel shown in FIGS. 8 and 9 according to the present invention, FIG. 11 is a sectional view of the exemplary LCD shown in FIG. 10 taken along line XI-XI', and FIG. 12 shows sectional views of the exemplary LCD shown in FIG. 10 taken along line XII-XII'.

As shown in FIGS. 8 to 13, an LCD includes a TFT array panel 100, a color filter panel 200 opposite the TFT array panel 100, and an LC layer 3 having LC molecules disposed between the TFT array panel 100 and the color filter panel 200.

First, the TFT array panel 100 will be described with reference to FIGS. 8 and 10 to 12.

A plurality of gate lines 121 and a plurality of storage electrode lines 131 are formed on an insulating substrate 110 of a material such as, but not limited to, transparent glass or plastic.

The gate lines 121 transmit gate signals and extend substantially in a transverse direction, a first direction. Each of the gate lines 121 includes a plurality of gate electrodes 124 projecting downward, in a second direction, and an end portion 129 having a large area for contact with another layer or an external driving circuit. A gate driving circuit (not shown) for generating the gate signals may be mounted on a flexible printed circuit ("FPC") film (not shown), which may be attached to the insulating substrate 110, directly mounted on the insulating substrate 110, or integrated onto the insulating substrate 110. Alternatively, the gate lines 121 may extend to be connected to a driving circuit that may be directly integrated on the insulating substrate 110.

The storage electrode lines 131 are supplied with a predetermined voltage, and each of the storage electrode lines 131 includes a stem extending substantially parallel to the gate lines 121 in the first direction and a plurality of pairs of storage electrodes 133a and 133b branched from the stems and extending in a second direction, substantially perpendicular to the first direction. Each of the storage electrode lines 131 is disposed between two adjacent gate lines 121, and a stem for each pixel area is positioned closer to one of the two adjacent gate lines 121. Each of the storage electrodes 133a and 133b has a fixed end portion connected to the stem and a free end portion disposed opposite thereto on an opposite side of the pixel area. The fixed end portion of the storage electrode 1 33a has a large area, and the free end portion thereof is bifurcated into a linear branch and a curved branch. However, the storage electrode lines 131 may have various shapes and arrangements and are not limited to the illustrated exemplary embodiments.

The gate lines 121 and the storage electrode lines 131 are preferably made of an aluminum Al-containing metal such as Al and an Al alloy, a silver Ag-containing metal such as Ag and an Ag alloy, a copper Cu-containing metal such as Cu and a Cu alloy, a molybdenum Mo-containing metal such as Mo and a Mo alloy, chromium Cr, tantalum Ta, or titanium Ti. The gate lines 121 and the storage electrode lines 131 may alternatively have a multi-layered structure including two conductive films (not shown) having different physical characteristics. If a multi-layered structure is employed, one of the two films is preferably made of a low resistivity metal such as an Al-containing metal, an Ag-containing metal, and a Cu-containing metal for reducing signal delay or voltage drop and the other film is preferably made of a material such as a Mo—containing metal, Cr, Ta, or Ti, which have good physical, chemical, and electrical contact characteristics with other materials such as indium tin oxide ("ITO") or indium zinc oxide ("IZO"). Examples of the combination of the two films in a multi-layered structure include a lower Cr film and an upper Al (alloy) film and a lower Al (alloy) film and an upper Mo (alloy) film. However, the gate lines 121 and the storage electrode lines 131 may be made of various metals or conductors.

The lateral sides of the gate lines 121 and the storage electrode lines 131 are inclined relative to a surface of the insulating substrate 110, and the inclination angle thereof ranges about 30 to about 80 degrees.

A gate insulating layer 140 preferably made of, but not limited to, silicon nitride (SiNx) or silicon oxide (SiOx) is formed on the gate lines 121 and the storage electrode lines 131. The gate insulating layer 140 may further be formed over exposed portions of the insulating substrate 110.

A plurality of semiconductor stripes 151 preferably made of hydrogenated amorphous silicon ("a-Si") or polysilicon are formed on the gate insulating layer 140. The semiconductor stripes 151 extend substantially in the longitudinal direction, the second direction parallel with the storage electrodes 133a and 133b, and become wide near the gate lines 121 and the storage electrode lines 131 such that the semiconductor stripes 151 cover large areas of the gate lines 121 and the storage electrode lines 131. Each of the semiconductor stripes 151 includes a plurality of projections 154 branched out toward the gate electrodes 124.

A plurality of ohmic contacts, including ohmic contact stripes and islands 161 and 165, are formed on the semiconductor stripes 151. The ohmic contact stripes and islands 161 and 165 are preferably made of n+ hydrogenated a-Si heavily doped with an N-type impurity such as phosphorous, or they may be made of silicide. Each ohmic contact stripe 161 includes a plurality of projections 163, and the projections 163 and the ohmic contact islands 165 are located in pairs on the projections 154 of the semiconductor stripes 151 and spaced apart from each other to form a channel on the projections 154.

The lateral sides of the semiconductor stripes 151 and the ohmic contacts 161 and 165 are inclined relative to the surface of the insulating substrate 110, and the inclination angles thereof are preferably in a range of about 30 to about 80 degrees.

A plurality of data lines 171 and a plurality of drain electrodes 175 are formed on the ohmic contacts 161 and 165 and the gate insulating layer 140.

The data lines 171 transmit data signals and extend substantially in the longitudinal direction, the second direction, to intersect the gate lines 121. The data lines 171 are insulated from the gate lines 121 by the gate insulating layer 140 disposed between the gate lines 121 and the data lines 171. Each data line 171 also intersects the storage electrode lines 131 and runs parallel between adjacent pairs of storage electrodes 133a and 133b. Each data line 171 includes a plurality of source electrodes 173 projecting toward the gate electrodes 124 and being curved like a crescent, and an end portion 179 having a large area for contact with another layer or an external driving circuit. A data driving circuit (not shown) for generating the data signals may be mounted on an FPC film (not shown), which may be attached to the insulating substrate 110, directly mounted on the insulating substrate 110, or integrated onto the insulating substrate 110. Alternatively, the data lines 171 may extend to be connected to a driving circuit that may be directly integrated on the insulating substrate 110.

The drain electrodes 175 are separated from the data lines 171 and disposed opposite the source electrodes 173 with respect to the gate electrodes 124, thus maintaining the channel over the projection 154. Each of the drain electrodes 175 includes a wide end portion and a narrow end portion. The wide end portion overlaps a storage electrode line 131 and the narrow end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175 and between the ohmic contact island 165 and the projection 163 of the ohmic contact stripe 161.

The data lines 171 and the drain electrodes 175 are preferably made of a refractory metal such as Cr, Mo, Ta, Ti, or alloys thereof. However, the data lines 171 and the drain electrodes 175 may alternatively have a multilayered structure including a refractory metal film (not shown) and a low resistivity film (not shown). Examples of the multi-layered structure include, but are not limited to, a double-layered structure including a lower Cr/Mo (alloy) film and an upper Al (alloy) film, and a triple-layered structure of a lower Mo (alloy) film, an intermediate Al (alloy) film, and an upper Mo (alloy) film. However, the data lines 171 and the drain electrodes 175 may be made of various metals or conductors.

The data lines 171 and the drain electrodes 175 have inclined edge profiles with respect to a surface of the insulating substrate 110, and the inclination angles thereof range about 30 to about 80 degrees.

The ohmic contacts 161 and 165 are interposed only between the underlying semiconductor stripes 151 and the overlying conductors 171 and 175 thereon, and reduce the contact resistance therebetween. Although the semiconductor stripes 151 are narrower than the data lines 171 at most places, the width of the semiconductor stripes 151 becomes large near the gate lines 121 and the storage electrode lines 131 as described above, to smooth the profile of the surface, thereby preventing disconnection of the data lines 171. The semiconductor stripes 151 have almost the same planar shapes as the data lines 171 and the drain electrodes 175 as well as the underlying ohmic contacts 161 and 165. However, the semiconductor stripes 151 include some exposed portions, which are not covered with the data lines 171 and the drain electrodes 175, such as portions located over the projections 154 between the source electrodes 173 and the drain electrodes 175, thus the exposed portions form a channel.

A passivation layer 180 is formed on the data lines 171, the drain electrodes 175, and the exposed portions of the semiconductor stripes 151. The passivation layer 180 may be further formed on exposed portions of the gate insulating layer 140 as shown. The passivation layer 180 is preferably made of an inorganic or organic insulator and it may have a flat top surface. Examples of the inorganic insulator include, but are not limited to, silicon nitride and silicon oxide. The organic insulator may have photosensitivity and a dielectric constant of less than about 4.0. Alternatively, the passivation layer 180 may include a lower film of an inorganic insulator and an upper film of an organic insulator such that it possesses the excellent insulating characteristics of the organic insulator while preventing the exposed portions of the semiconductor stripes 151 from being damaged with the organic insulator.

The passivation layer 180 has a plurality of contact holes 182 and 185 exposing the end portions 179 of the data lines 171 and the drain electrodes 175, respectively. The passivation layer 180 and the gate insulating layer 140 have a plurality of contact holes 181 exposing end portions 129 of the gate lines 121, a plurality of contact holes 183a exposing portions of the storage electrode lines 131 near the fixed end portions of the storage electrodes 133a, and a plurality of contact holes 183b exposing the linear branches of the free end portions of the storage electrodes 133a.

A plurality of pixel electrodes 191, a plurality of overpasses 83, and a plurality of contact assistants 81 and 82 are formed on the passivation layer 180. They are preferably made of a transparent conductor such as ITO or IZO, or a reflective conductor such as Ag, Al, Cr, or alloys thereof, such as for use in a reflective LCD.

The pixel electrodes 191 are physically and electrically connected to the drain electrodes 175 through the contact holes 185 such that the pixel electrodes 191 receive data voltages from the drain electrodes 175. The pixel electrodes 191 supplied with the data voltages generate electric fields in cooperation with a common electrode 270 of the opposing color filter panel 200 supplied with a common voltage, which determine the orientations of liquid crystal molecules (not shown) of a liquid crystal layer 3 disposed between the two panels 100 and 200. A pixel electrode 191 and the common electrode 270 form a capacitor referred to as a "liquid crystal capacitor," which stores applied voltages after the TFT turns off.

A pixel electrode 191 overlaps a storage electrode line 131 including storage electrodes 133a and 133b for improving an aperture ratio of each pixel. The pixel electrode 191 and a drain electrode 175 connected thereto and the storage electrode line 131 form an additional capacitor referred to as a "storage capacitor," which enhances the voltage storing capacity of the liquid crystal capacitor.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices, such as a gate driving circuit and a data driving circuit as previously described.

The overpasses 83 cross over the gate lines 121 and are connected to the exposed portions of the storage electrode lines 131 and the exposed linear branches of the free end portions of the storage electrodes 133a through the contact holes 183a and 183b, respectively, which are disposed opposite each other with respect to the gate lines 121. That is, each overpass 83 spans between two adjacent pixels. Thus, each pixel includes a portion of a first overpass 83 at a lower portion of the pixel area and a portion of a second overpass 83 at an upper portion of the pixel area. The storage electrode lines 131 including the storage electrodes 133a and 133b along with the overpasses 83 can be used for repairing defects in the gate lines 121, the data lines 171, or the TFTs.

A description of the color filter panel 200 follows with reference to FIGS. 9 to 11.

A light blocking member 220, also termed a black matrix, for preventing light leakage is formed on an insulating substrate 210 made of a material such as transparent glass or plastic.

The light blocking member 220 has a plurality of openings 225 that face the pixel electrodes 191, and it may have substantially the same planar shape as the pixel electrodes 191. Otherwise, the light blocking member 220 may include a plurality of portions facing the gate lines 121 and data lines 171 on the TFT array panel 100 and a plurality of widened portions facing the TFTs on the TFT array panel 100. The light blocking member 220 functions as side walls for sealing ink 5 for color filters 230 therein when manufacturing the color filter panel 200 using the exemplary embodiments of the inkjet printing system.

A plurality of color filters 230 are also formed on the substrate 210. The color filters 230 are formed using any of the exemplary embodiments of the inkjet printing system according to the present invention. The color filters 230 are formed substantially in openings 225 enclosed by the light blocking member 220. Alternatively, the color filters 230 may extend substantially in the longitudinal direction along the pixel electrodes 191. The color filters 230 may each represent one of the colors such as red, green, and blue colors, although other colors are within the scope of these embodiments.

An overcoat 250 is formed on the color filters 230 and the light blocking member 220. The overcoat 250 is preferably made of an (organic) insulator for preventing the color filters 230 from being exposed and for providing a flat surface. Alternatively, the overcoat 250 may be omitted.

A common electrode 270 is formed on the overcoat 250. The common electrode 270 is preferably made of a transparent conductive material such as, but not limited to, ITO and IZO.

Alignment layers 11 and 21 that may be horizontal or vertical alignment layers are coated on inner surfaces of the panels 100 and 200, and polarizers 12 and 22 are provided on outer surfaces of the panels 100 and 200 so that their polarization axes may cross perpendicularly with respect to each other and one of the polarization axes may be parallel to the gate lines 121. Alternatively, one of the polarizers 12 and 22 may be omitted when the LCD is a reflective LCD.

The LCD may further include at least one retardation film (not shown) for compensating the retardation of the LC layer 3.

The LCD may further include a backlight unit (not shown) for supplying light to the LC layer 3 through the polarizers 12 and 22, the retardation film, and the panels 100 and 200.

Now, an exemplary method of manufacturing the exemplary TFT array panel shown in FIGS. 8 to 12 will be described.

A metal film is sputtered on an insulating substrate 110 made of a material such as transparent glass or plastic, and is patterned by wet etching or dry etching with a photoresist pattern to form a plurality of gate lines 121 including a plurality of gate electrodes 124 and an end portion 129 and a plurality of storage electrode lines 131 having a pair of storage electrodes 133a and 133b.

After sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes and a plurality of intrinsic semiconductor stripes 151 including a plurality of projections 154 on the gate insulating layer 140. The gate insulating layer 140 has a thickness of about 1,500 Å to about 5,500 Å, the intrinsic a-Si layer has a thickness of about 500 Å to about 2,000 Å, and the extrinsic a-Si layer thickness is about 300 Å to about 600 Å.

A conductive layer is sputtered with a thickness of about 1,500 Å to about 3,000 Å, and is patterned by etching with a photoresist pattern to form a plurality of data lines 171, each including a plurality of source electrodes 173 and end portion 179, and a plurality of drain electrodes 175.

Portions of the extrinsic a-Si layer which are not covered with the data lines 171 and the drain electrodes 175 are removed by etching to complete a plurality of ohmic contact stripes 161 including a plurality of projections 163 and a plurality of ohmic contact islands 165, and to expose portions of the intrinsic semiconductor stripes 151. Oxygen plasma treatment may follow thereafter in order to stabilize the exposed surfaces of the semiconductor stripes 151.

A passivation layer 180 preferably made of positive photosensitive organic materials is deposited on the data lines 171, the drain electrodes 175, and the exposed semiconductor stripes 151, as well as exposed portions of the gate insulating layer 140.

The passivation layer 180 is exposed to light through a photo mask. The photo mask includes a transparent substrate and an opaque light blocking film, and it is divided into light transmitting areas, light blocking areas, and translucent areas. The light blocking film is not disposed on the light transmitting areas, but it is disposed on the light blocking areas and the translucent areas. The light blocking film exists as a wide area having a width larger than a predetermined value on the light blocking areas, and it exists as a plurality of areas having width or distance smaller than a predetermined value to form slits.

The passivation layer 180 is developed to form a plurality of contact holes 182 and 185 exposing the end portions 179 of the data lines 171 and the drain electrodes 175. The passivation layer 180 is also developed along with the gate insulating layer 140 to form the contact holes 181, 183a, and 183b exposing the end portions 129 of the gate lines 121, and the storage electrodes 133a and 133b of the storage electrode lines 131, respectively.

When the passivation layer 180 is made of negative photosensitive materials, the positions of the light transmitting areas and the light blocking areas of the photo mask are changed with each other.

Finally, IZO or ITO with a thickness of about 400 Å to about 500 Å is sputtered and etched to form a plurality of pixel electrodes 191, a plurality of contact assistants 81 and 82, and overpasses 83 on the passivation layer 180, the exposed drain electrodes 175, the end portions 179 of the data lines 171, the end portions 129 of the gate lines 121, and the exposed storage electrode lines 131. The alignment layer 11 may be provided on the TFT array panel 100 using an inkjet printing system or other method.

While exemplary embodiments of an LCD, and an exemplary TFT array panel 100 and an exemplary color filter panel 200 for an LCD, have been described, it should be understood that the exemplary embodiments of the inkjet printing system according to the present invention may be utilized to form color filters 230 on other embodiments of LCDs not described herein.

Next, an OLED display using a panel manufactured by the exemplary embodiments of the inkjet printing system according to the present invention will be described with reference to the accompanying drawings.

First, an exemplary OLED display according to the present invention is described with reference to FIG. 13.

Figure 13:
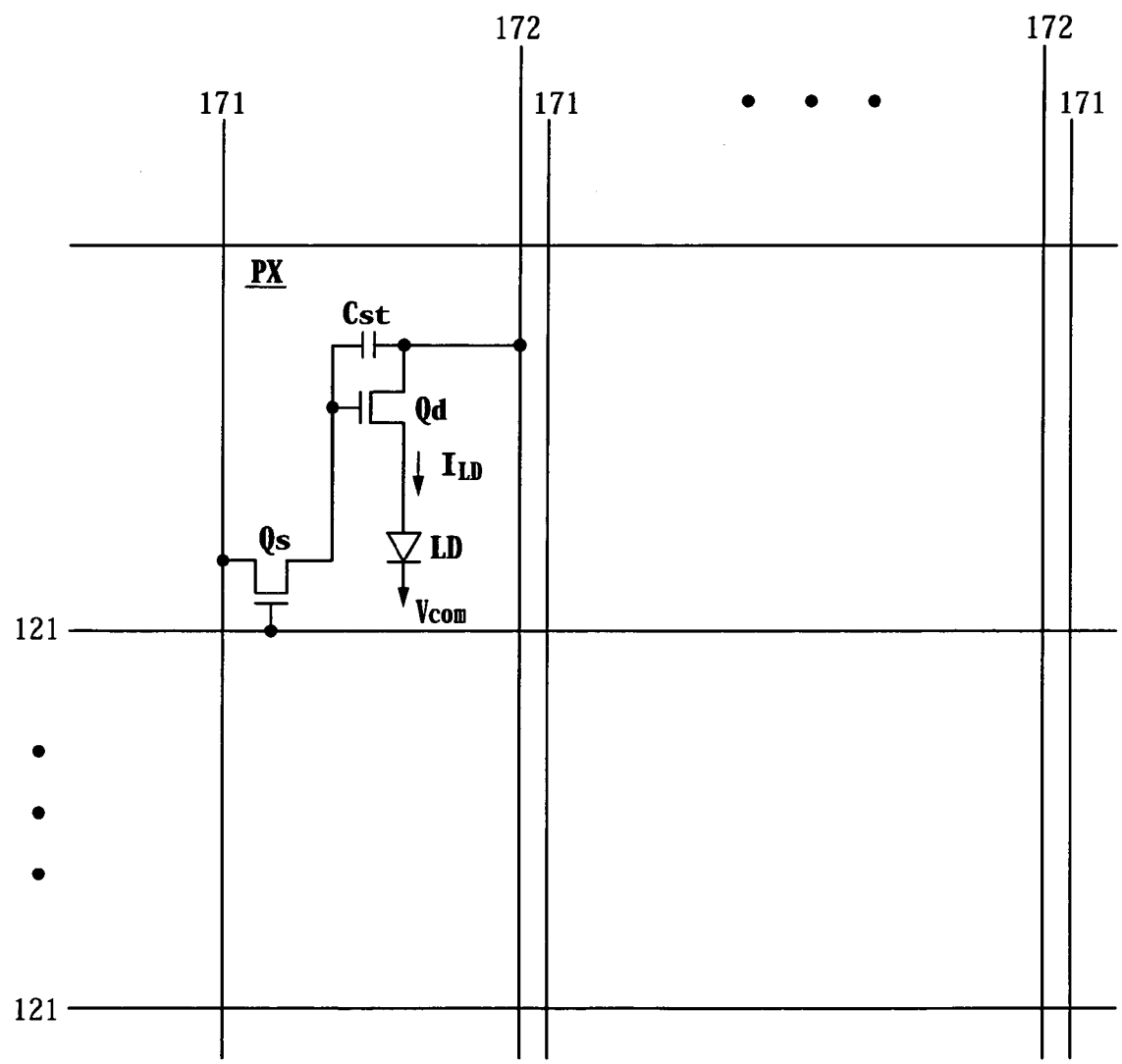
FIG. 13 is an equivalent circuit diagram of an exemplary pixel of an exemplary embodiment of an OLED display according to the present invention.

FIG. 13 is an equivalent circuit diagram of an exemplary pixel of an exemplary embodiment of an OLED display according to the present invention.

Referring to FIG. 13, an OLED display includes a plurality of signal lines 121, 171, and 172 and a plurality of pixels PX connected thereto and arranged substantially in a matrix.

The signal lines 121, 171, and 172 include a plurality of gate lines 121, a plurality of data lines 171, and a plurality of voltage transmission lines 172.

The gate lines 121 transmit gate signals (or scanning signals), extend substantially in a row direction, first direction, and are substantially parallel to each other. The data lines 171 transmit data signals, extend substantially in a column direction, second direction, and are substantially parallel to each other and substantially perpendicular to the gate lines 121. The voltage transmission lines 172 transmit driving voltages, extend substantially in the column direction, and are substantially parallel to each other and substantially parallel to the data lines 171.

Each pixel PX includes a switching transistor Qs, a driving transistor Qd, a storage capacitor Cst, and an organic light emitting element LD.

The switching transistor Qs has a control terminal corresponding to a gate connected to the gate line 121, an input terminal corresponding to a source connected to the data line 171, and an output terminal corresponding to a drain connected to the driving transistor Qd. The switching transistor Qs transmits the data signal applied to the data line 171 to the driving transistor Qd in response to the scanning signal, otherwise termed gate signal, applied to the gate line 121.

The driving transistor Qd has a control terminal connected to the switching transistor Qs, an input terminal connected to the voltage transmission line 172, and an output terminal connected to the light emitting element LD. The driving transistor Qd flows a current having a magnitude depending on a voltage applied between the control terminal and the output terminal thereof.

The storage capacitor Cst is connected between the control terminal and the output terminal of the driving transistor Qd. The storage capacitor Cst charges and maintains the data signal applied to the control terminal of the driving transistor Qd from the switching transistor Qs.

The light emitting element LD has an anode connected to the output terminal of the driving transistor Qd and a cathode connected to a common voltage Vcom. The light emitting element LD emits light having an intensity depending on an output current $I_{LD}$ of the driving transistor Qd.

The switching transistor Qs and the driving transistor Qd are N-channel field effect transistors ("FETs"). Alternatively, at least one of the transistors Qs and Qd may be a P-channel FET. While a particular configuration has been shown, the connections between the transistors Qs and Qd, the capacitor Cst, and the light emitting element LD may be modified, and such modifications are within the scope of these embodiments.

Now, a structure of an exemplary display panel for an exemplary embodiment of the OLED according to the present invention will be described with reference to FIGS. 14 to 16.

Figure 14:
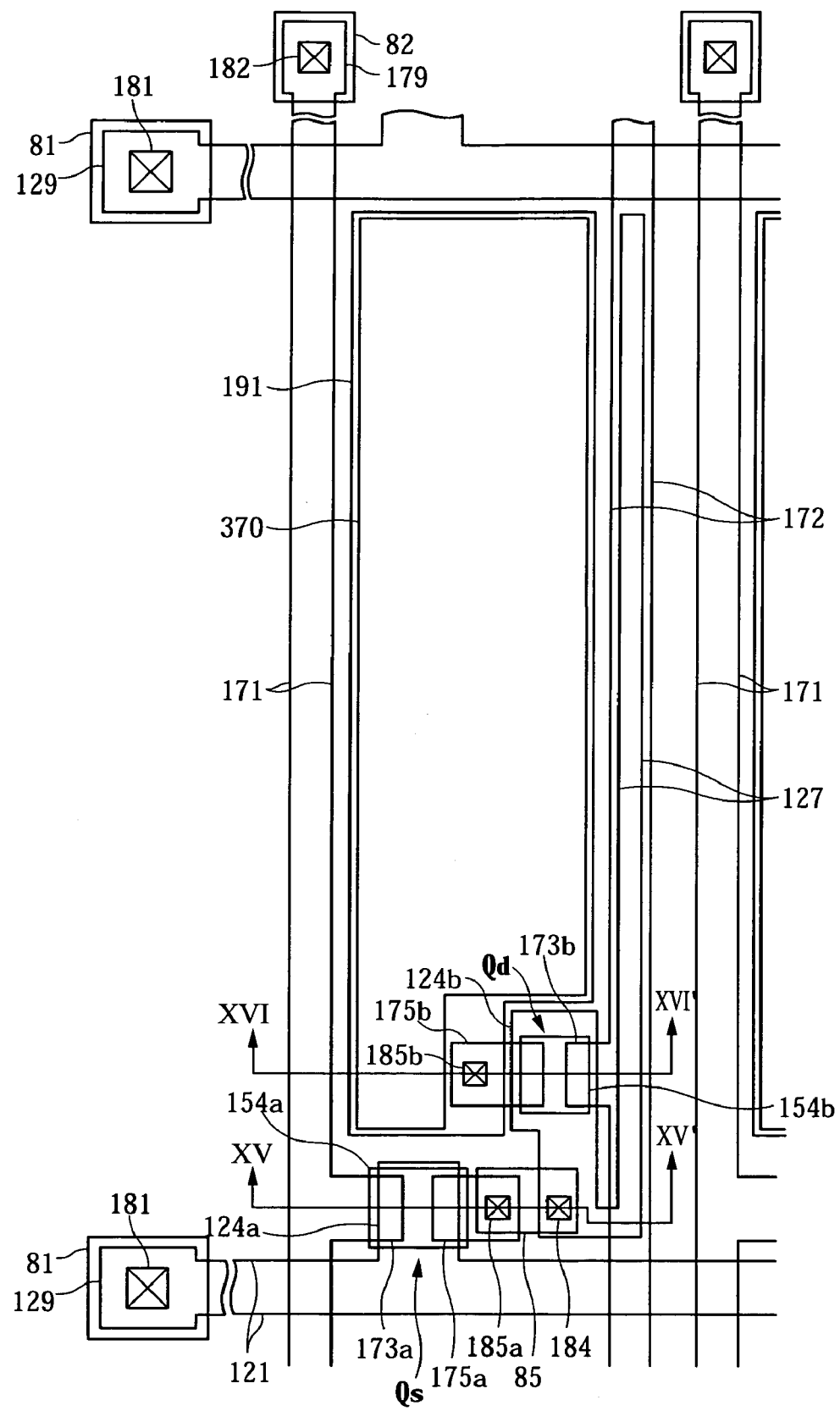
FIG. 14 is a schematic plan view of an exemplary display panel for an exemplary embodiment of an OLED according to the present invention.
Figure 15:
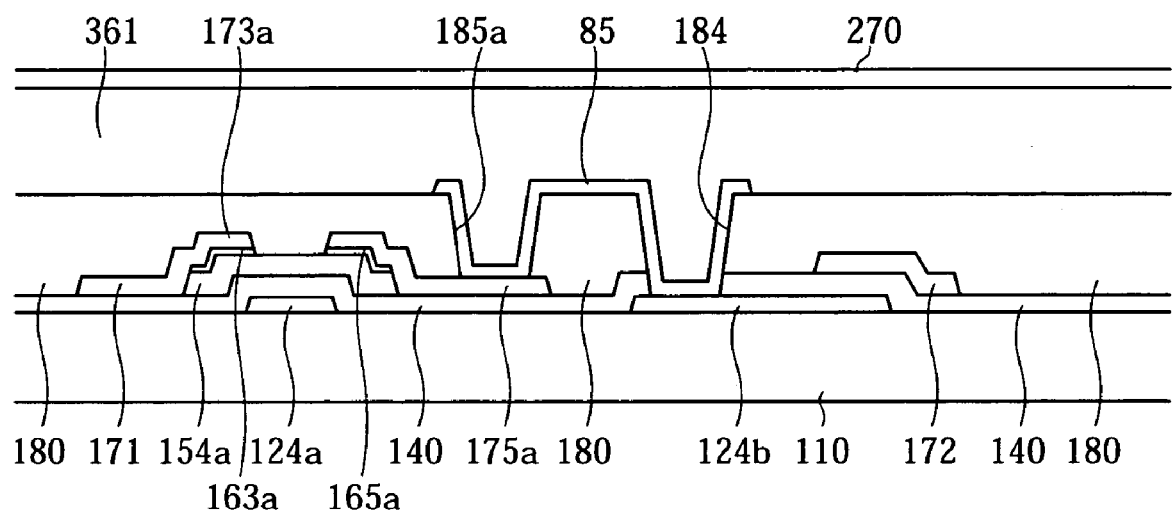
FIG. 15 is a sectional view of the exemplary display panel shown in FIG. 14 taken along line XV-XV'.
Figure 16:
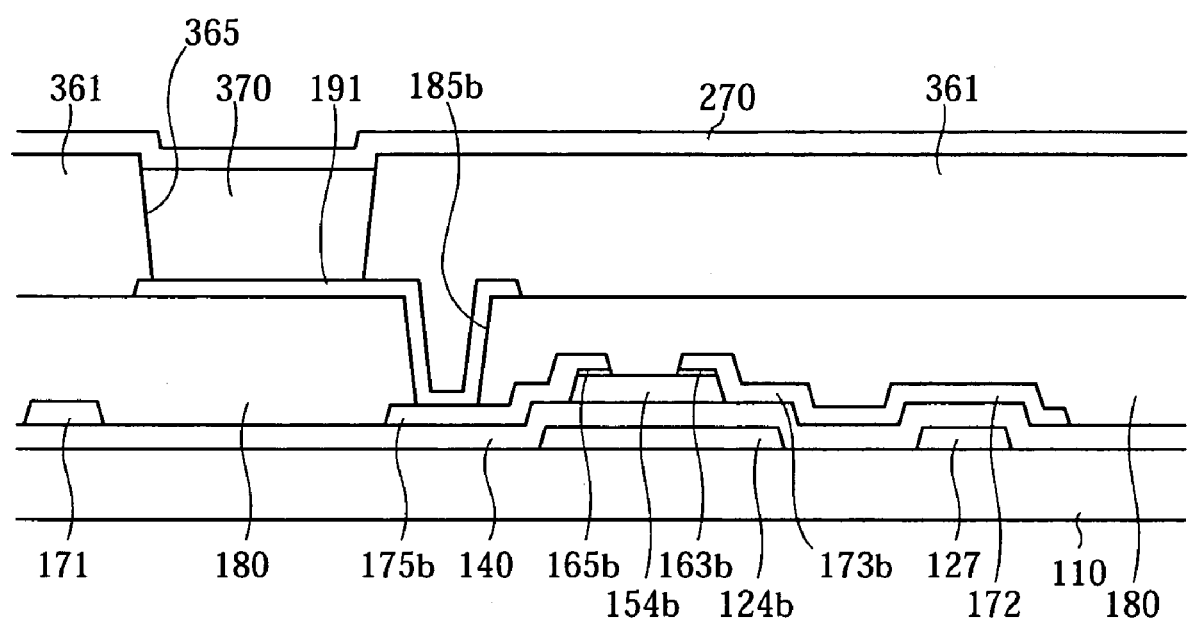
FIG. 16 is a sectional view of the exemplary display panel shown in FIG. 14 taken along line XVI-XVI'.

FIG. 14 is a schematic plan view of an exemplary display panel for an exemplary embodiment of an OLED according to the present invention, FIG. 15 is a sectional view of the exemplary display panel shown in FIG. 14 taken along line XV-XV', and FIG. 16 is a sectional view of the exemplary display panel shown in FIG. 14 taken along line XVI-XVI'.

A plurality of gate conductors that include a plurality of gate lines 121 including first gate electrodes 124a and second gate electrodes 124b are formed on an insulating substrate 110. The insulating substrate 110 may be formed from a material such as, but not limited to, transparent glass or plastic. The first and second gate electrodes 124a and 124b may also be termed control electrodes.

The gate lines 121 transmit gate signals and extend substantially in a transverse direction, a first direction. Each of the gate lines 121 includes an end portion 129 having a large area for contact with another layer or an external driving circuit. The first gate electrodes 124a project upward from the gate lines 121. A gate driving circuit (not shown) for generating the gate signals may be mounted on a flexible printed circuit ("FPC") film (not shown), which may be attached to the insulating substrate 110, directly mounted on the insulating substrate 110, or integrated onto the insulating substrate 110. Alternatively, the gate lines 121 may extend to be connected to a driving circuit that may be directly integrated on the insulating substrate 110.

Each of the second gate electrodes 124b is separated from the gate lines 121 and disposed between two adjacent gate lines 121. Each second gate electrode 124b includes a storage electrode 127 that extends downwardly from the second gate electrode 124b in a second direction, turns to the right towards a side of a pixel, and then extends lengthwise back upwardly in the second direction. The storage electrode 127 may extend substantially a full length of a pixel.

The gate conductors 121 and 124b, that include the gate lines 121 and the first and second gate electrodes 124a and 124b, are preferably made of an Al containing metal such as Al and Al alloy, a Ag containing metal such as Ag and Ag alloy, a Cu containing metal such as Cu and Cu alloy, a Mo containing metal such as Mo and Mo alloy, Cr, Ti or Ta. The gate conductors 121 and 124b may have a multi-layered structure including two films having different physical characteristics. In such a multi-layered structure, one of the two films is preferably made of low resistivity metal including an Al containing metal, an Ag containing metal, or a Cu containing metal for reducing signal delay or voltage drop in the gate conductors 121 and 124b, and the other film is preferably made of material such as Cr, Mo, Mo alloy, Ta, or Ti, which has good physical, chemical, and electrical contact characteristics with other materials such as ITO or IZO. Examples of the combination of the two films include a lower Cr film and an upper Al (alloy) film and a lower Al (alloy) film and an upper Mo (alloy) film. However, the gate conductors 121 and 124b may be made of various metals or conductors.

The lateral sides of the gate conductors 121 and 124b are inclined relative to a surface of the insulating substrate 110, and the inclination angle thereof ranges about 30 to about 80 degrees.

A gate insulating layer 140 preferably made of silicon nitride (SiNx) or silicon oxide (SiOx) is formed on the gate conductors 121 and 124b. The gate insulating layer 140 may be further formed on exposed portions of the insulating substrate 110.

A plurality of semiconductor islands 154a and 154b preferably made of hydrogenated a-Si or polysilicon are formed on the gate insulating layer 140. The semiconductor islands 154a and 154b are disposed on the first and second gate electrodes 124a and 124b, respectively.

A plurality of pairs of first and second ohmic contact islands 163a and 163b and a plurality of pairs of third and fourth ohmic contact islands 165a and 165b are formed on the semiconductor islands 154a and 154b, respectively. The ohmic contact islands 163a, 163b, 165a, and 165b are preferably made of n+ hydrogenated a-Si heavily doped with an N-type impurity such as phosphorous, or they may be made of silicide.

The first ohmic contact islands 163a and 165a are disposed on the first semiconductor island 154a and separated from each other in pair and the second ohmic contact islands 163b and 165b are disposed on the first semiconductor island 154a and separated from each other in pair.

The lateral sides of the semiconductor islands 154a and 154b and the ohmic contacts 163a, 163b, 165a, and 165b are inclined relative to the surface of the insulating substrate 110, and the inclination angles thereof are preferably in a range of about 30 to about 80 degrees.

A plurality of data conductors including a plurality of data lines 171, a plurality of voltage transmission lines 172, and a plurality of output electrodes 175a and 175b are formed on the ohmic contacts 163a, 163b, 165a, and 165a and the gate insulating layer 140.

The data lines 171 for transmitting data signals extend substantially in the longitudinal direction, the second direction, and intersect the gate lines 121 substantially perpendicularly. The data lines 171 may be insulated from the gate lines 121 by the gate insulating layer 140. Each data line 171 may include a plurality of first input electrodes 173a projecting toward the first gate electrode 124a and an end portion 179 having a large area for contact with another layer or an external driving circuit. A data driving circuit (not shown) for generating the data signals may be mounted on a FPC film (not shown), which may be attached to the insulating substrate 110, directly mounted on the insulating substrate 110, or integrated into the insulating substrate 110. Alternatively, the data lines 171 may extend to be connected to a driving circuit that may be directly integrated in the insulating substrate 110.

The voltage transmission lines 172 for transmitting driving voltages for the driving transistor Qd extend substantially in the longitudinal direction, second direction, and intersect the gate lines 121 and extend parallel to the data lines 171. Each voltage transmission line 172 includes a plurality of second source electrodes 173b projecting toward the second gate electrode 124b. The voltage transmission lines 172 may overlap the storage electrodes 127 and be connected to each other.

The first and second drain electrodes 175a and 175b are separated from each other and separated from the data lines 171 and the voltage transmission lines 172. The first and second drain electrodes 175a and 175b may also be termed output electrodes.

The first source electrodes 173a, which are input electrodes, are disposed opposite the first drain electrodes 175a with respect to the first gate electrodes 124a and the second source electrodes 173b, which are input electrodes, are disposed opposite the second drain electrodes 175b with respect to the second gate electrodes 124b.

The data conductors 171, 172, 175a, and 175b are preferably made of a refractory metal such as Cr, Mo, Ta, Ti, or alloys thereof. However, they may have a multilayered structure including a refractory metal film (not shown) and a low resistivity film (not shown). Examples of the multi-layered structure include a double-layered structure including a lower Cr/Mo (alloy) film and an upper Al (alloy) film and a triple-layered structure of a lower Mo (alloy) film, an intermediate Al (alloy) film, and an upper Mo (alloy) film. However, data conductors 171, 172, 175a, and 175b may be made of various metals or conductors.

Like the gate conductors 121 and 124b, the lateral sides of the data conductors 171, 172, 175a, and 175b are inclined relative to a surface of the insulating substrate 110, and the inclination angle thereof ranges about 30 to about 80 degrees.

The ohmic contacts 163a, 163b, 165a, 165b are interposed only between the underlying semiconductor islands 154a and 154b and the overlying data conductors 171, 172, 175a, and 175b thereon and reduce the contact resistance there between. The semiconductor islands 154a and 154b include some exposed portions, which are not covered with the data conductors 171, 172, 175a, and 175b, such as portions located between the source electrodes 173a and 173b and the drain electrodes 175a and 175b, and between the ohmic contact islands 163a and 163b and the ohmic contact islands 165a and 165b, thus forming channels there between on the semiconductor islands 154a and 154b.

A passivation layer 180 is formed on the data conductors 171, 172, 175a, and 175b and the exposed portions of semiconductor islands 154a and 154b. The passivation layer 180 may further be formed on the exposed portions of the gate insulating layer 140. The passivation layer 180 is preferably made of inorganic or organic insulator and it may have a flat top surface. Examples of the inorganic insulator include silicon nitride and silicon oxide. The organic insulator may have photosensitivity and dielectric constant less than about 4.0. The passivation layer 180 may include a lower film of inorganic insulator and an upper film of organic insulator, such that it possesses the excellent insulating characteristics of the organic insulator while preventing the exposed portions of the semiconductor islands 154 and 154b from being damaged by the organic insulator.

The passivation layer 180 has a plurality of contact holes 182, 185a, and 185b exposing the end portions 179 of the data lines 171 and the first and second drain electrodes 175a and 175b, respectively. The passivation layer 180 and the gate insulating layer 140 have a plurality of contact holes 181 and 184 exposing the end portions 129 of the gate lines 121 and the second gate electrodes 124b, respectively.

A plurality of pixel electrodes 191, a plurality of connecting members 85, and a plurality of contact assistants 81 and 82 are formed on the passivation layer 180. They are preferably made of a transparent conductor such as ITO or IZO or a reflective conductor such as Ag, Al, Cr, or alloys thereof.

The pixel electrodes 191 are physically and electrically connected to the second drain electrodes 175b through the contact holes 185b. The connecting members 85 are physically and electrically connected to the second gate electrodes 124b and the first drain electrodes 175a through the contact holes 184 and 185a, respectively.

The contact assistants 81 and 82 are physically and electrically connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices, such as a gate driving circuit and a data driving circuit.

A partition 361 is formed on the passivation layer 180 and may overlap peripheral portions of the pixel electrode 191.

The partition 361 surrounds the pixel electrodes 191 like a bank, to define openings 365 to be filled with organic light emitting material. The partition 361 is preferably made of organic or inorganic insulating material. The partition 361 may be also formed of photoresist including a black pigment to function as a light blocking member, such that a manufacturing procedure is simplified.

A plurality of light emitting members 370 are formed on the pixel electrodes 191 and disposed in the openings 365 defined by the partition 361. The organic light emitting members 370 are formed using an exemplary embodiment of the inkjet printing system according to the present invention. That is, instead of the insulating substrates 210 with light blocking members 220 provided on the stage 500, the panel prepared as shown in FIGS. 14 to 16 is provided on the stage 500 for receipt of material for forming the light emitting members 370 within the openings 365. The light emitting members 370 are preferably made of organic material emitting primary-color lights such as red, green, and blue lights. Thus, the ink 5 is replaced by material for forming the light emitting members 370. The light emitting members 370, such as red, green, and blue light emitting members 370, are periodically arranged. The OLED represents a desired color by summing the colors from the light emitting members 370 in space.

Each organic light emitting member 370 may have a multilayered structure. For example, the organic light emitting member 370 includes an emitting layer (not shown) emitting light and auxiliary layers (not shown) for improving the efficiency of light emission of the emitting layer. The auxiliary layers may include an electron transport layer (not shown) and a hole transport layer (not shown) for improving the balance of the electrons and holes, and an electron injecting layer (not shown) and a hole injecting layer (not shown) for improving the injection of the electrons and holes.

A common electrode 270 is formed on the light emitting members 370. The common electrode 270 may further be formed on the partition 361. The common electrode 270 is supplied with the common voltage Vcom. The common electrode 270 may be preferably made of reflective conductors such as Al, calcium Ca, barium Ba, and magnesium Mg or alloys thereof or transparent conductors such as ITO or IZO.

In the above-described OLED, a first gate electrode 124a connected to the gate line 121, a first source electrode 173a connected to the data line 171, and a first drain electrode 175a along with a first semiconductor island 154a form a switching TFT Qs having a channel formed in the semiconductor island 154a disposed between the first source electrode 173a and the first drain electrode 175a. A second gate electrode 124b connected to the first drain electrode 175a, a second source electrode 173b connected to the voltage transmission line 172, and a second drain electrode 175b along with a second semiconductor island 154b form a driving TFT Qd having a channel formed in the semiconductor island 154b disposed between the second source electrode 173b and the second drain electrode 175b. In the switching TFT Qs and the driving TFT Qd, the gate electrodes 124a and 124b form control electrodes, the source electrodes 173a and 173b form input electrodes, and the drain electrodes 175a and 175b form output electrodes. The pixel electrodes 191, the organic light emitting members 370, and the common electrode 270 form organic light emitting elements LD. The pixel electrode 191 may be an anode terminal and the common electrode 270 may be a cathode terminal. Alternatively, the pixel electrode 191 may be a cathode terminal and the common electrode 270 may be an anode terminal. Furthermore, a storage electrode 127 and a voltage transmission line 172 overlapped with each other form a storage capacitor Cst.

The OLED emits light upwardly or downwardly with respect to the insulating substrate 110 to represent the images.

An opaque pixel electrode 191 and a transparent common electrode 270 are used in OLEDs of a top emission type representing the images upwardly with respect to the insulating substrate 110. A transparent pixel electrode 191 and a transparent common electrode 270 are used in OLEDs of a bottom emission type representing the images downwardly with respect to the insulating substrate 110.

Meanwhile, when the semiconductor islands 154a and 154b are made of polysilicon, the OLED includes intrinsic regions (not shown) disposed opposite with respect to the gate electrodes 124a and 124b, respectively and extrinsic regions (not shown) disposed on the intrinsic regions. The extrinsic regions are electrically connected to the input electrodes 173a and 173b and the output electrodes 175a and 175b, and the ohmic contacts 163a, 163b, 165a, and 165b may be omitted.

While the illustrated embodiment shows the gate electrodes 124a and 124b disposed between the semiconductors 154a, 154b and the insulating substrate 110, in an alternative embodiment, the gate electrodes 124a and 124b may be disposed on the semiconductors 154a, 154b, such that the semiconductors 154a, 154b are disposed between the gate electrodes 124a, 124b and the insulating substrate 110. In this case, the gate insulating layer 140 is disposed between the semiconductors 154a, 154b and the control electrodes 124a and 124b. Also in such an embodiment, the data conductors 171, 172, 175a, and 175b are disposed on the gate insulating layer 140 and electrically connected to the semiconductors 154a and 154b through contact holes (not shown) formed on the gate insulating layer 140. In yet another embodiment, the data conductors 171, 172, 175a, and 175b are disposed under the semiconductor islands 154a and 154b and may be connected to the overlaying semiconductor islands 154a and 154b.

While semiconductors made of a-Si have been described for use in the OLED, the present invention may also be adopted to OLEDs including semiconductors made of polysilicon.

Thus, an inkjet printing system is provided for forming color filters on a color filter layer of an LCD and for forming light emitting members on an OLED. Alignment keys are provided on a panel arranged to receive material for forming the color filters or the light emitting members. The alignment keys are sensed by an alignment key position sensor, and the sensed signals are converted into control signals for proper positioning of a head unit supporting an inkjet head. The alignment key position sensor may be provided on the head unit or on an alignment key sensing unit separate from the head unit.

A driving method of the inkjet printing system includes sensing positions of the alignment keys using the alignment key position sensor to generate sensing signals and using the sensing signals to align a position of the head unit. The sensing signals may be stored in a memory for comparison with a current position of the head unit to generate control signals for aligning the head unit.

By the aligning operation of the head unit using the alignment keys and the alignment key position sensor, the color filters or light emitting members are accurately formed on desired positions of the substrates, thus increasing reliability and decreasing manufacturing cost.

While the present invention has been described in detail with reference to the preferred embodiments, it is to be understood that the invention is not limited to the disclosed embodiments, but, on the contrary, is intended to cover various modifications and equivalent arrangements included within the spirit and scope of the appended claims.

What is claimed is:

1. An inkjet printing system comprising:
   a first stage mounted with a mother glass, the mother glass including a plurality of substrates and a plurality of alignment keys;
   a head unit having at least one inkjet head;

an alignment key position sensing unit sensing positions of the alignment keys to generate a plurality of sensing signals respectively corresponding to the alignment keys;

a memory storing the sensing signals; and a transporting unit controller comparing a current position of the head unit and the sensing signal corresponding to positions of the alignment keys to align the head unit, wherein the alignment keys comprise a first alignment key disposed on a side of each of the substrates, and a second alignment key disposed on an opposite side of each of the substrates, the opposite side opposing the first alignment key with respect to each of the substrates.

2. The system of claim 1, wherein the alignment key position sensing unit comprises at least one alignment key position sensor, and the at least one alignment key position sensor is a charged coupled device camera.

3. The system of claim 1, wherein each substrate includes a light blocking member having a plurality of openings, and the at least one inkjet head deposits ink into the openings.

4. The system of claim 1, wherein each substrate includes portions of an organic light emitting display having a plurality of openings, and the at least one inkjet head deposits light emitting material into the openings.

5. The system of claim 1, wherein the first alignment key determines a start position of scanning of the head unit and the second alignment key determines an end position of the scanning of the head unit.

6. The system of claim 5, wherein the sensing signal comprises information on positions of the first alignment key and the second alignment key.

7. The system of claim 1, wherein the alignment key position sensing unit is attached to a second stage.

8. The system of claim 7, wherein the second stage is substantially similar in size and shape to the mother glass.

9. The system of claim 7, wherein the second stage is positioned above the head unit.

* * * * *